United States Patent
Tatsuoka et al.

(10) Patent No.: US 9,797,040 B2
(45) Date of Patent: Oct. 24, 2017

(54) SURFACE COATED CUTTING TOOL

(71) Applicant: MITSUBISHI MATERIALS CORPORATION, Tokyo (JP)

(72) Inventors: Sho Tatsuoka, Naka (JP); Kenji Yamaguchi, Naka (JP); Akira Osada, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 43 days.

(21) Appl. No.: 14/781,522

(22) PCT Filed: Apr. 1, 2014

(86) PCT No.: PCT/JP2014/059648
§ 371 (c)(1),
(2) Date: Sep. 30, 2015

(87) PCT Pub. No.: WO2014/163081
PCT Pub. Date: Oct. 9, 2014

(65) Prior Publication Data
US 2016/0040285 A1 Feb. 11, 2016

(30) Foreign Application Priority Data

Apr. 1, 2013 (JP) ................................ 2013-075856
Mar. 31, 2014 (JP) ................................ 2014-070927

(51) Int. Cl.
*B23B 27/14* (2006.01)
*C23C 16/34* (2006.01)
(Continued)

(52) U.S. Cl.
CPC ............ *C23C 16/34* (2013.01); *B23B 27/148* (2013.01); *C23C 16/36* (2013.01);
(Continued)

(58) Field of Classification Search
USPC .......... 51/307, 309; 428/336, 697, 698, 699, 428/701, 702; 427/255.23, 255.28,
(Continued)

(56) References Cited

U.S. PATENT DOCUMENTS 6,103,357 A * 8/2000 Selinder .............. C23C 14/0635
428/699
7,767,320 B2 * 8/2010 Endler .................... C23C 16/34
428/697

(Continued)

FOREIGN PATENT DOCUMENTS

| CN | 101952482 A | 1/2011 |
| CN | 102859026 A | 1/2013 |

(Continued)

OTHER PUBLICATIONS

International Search Report mailed Jul. 1, 2014 for the corresponding PCT Application No. PCT/JP2014/059648.
(Continued)

*Primary Examiner* — Archene Turner
(74) *Attorney, Agent, or Firm* — Leason Ellis LLP

(57) ABSTRACT

A hard coating layer on a cutting tool includes at least a Ti and Al complex nitride or carbonitride layer and has an average layer thickness of 1 to 20 μm. In a case where a composition of the complex nitride or carbonitride layer is expressed by: $(Ti_{1-x}Al_x)(C_yN_{1-y})$, a content ratio x and a content ratio y satisfy $0.60 \leq x \leq 0.95$ and $0 \leq y \leq 0.005$, where x and y are in atomic ratio. Crystal grains constituting the complex nitride or carbonitride layer include cubic phase crystal grains and hexagonal phase crystal grains. An area ratio occupied by the cubic phase crystal grains is 30-80%. An average grain width W is 0.05-1.0 μm. An average aspect ratio A of the crystal grains with the cubic grain structure is 5 or less. A periodic content ratio change of Ti and Al in
(Continued)

$(Ti_{1-x}Al_x)(C_yN_{1-y})$ exists in each of the cubic phase crystal grains.

10 Claims, 3 Drawing Sheets

(51) Int. Cl.
  *C23C 16/36* (2006.01)
  *C23C 16/455* (2006.01)
(52) U.S. Cl.
  CPC .... *C23C 16/45523* (2013.01); *B23B 2228/04* (2013.01); *B23B 2228/105* (2013.01)
(58) Field of Classification Search
  USPC .................................................... 427/255.36
  See application file for complete search history.

(56) References Cited

U.S. PATENT DOCUMENTS

| | | | | |
|---|---|---|---|---|
| 2010/0233511 | A1* | 9/2010 | Endler | C23C 16/029 428/698 |
| 2010/0323176 | A1 | 12/2010 | Van Den Berg et al. | |
| 2011/0003126 | A1 | 1/2011 | Van Den Berg et al. | |
| 2011/0081539 | A1* | 4/2011 | Ni | C23C 14/0641 51/307 |
| 2011/0111197 | A1* | 5/2011 | Johansson | B23B 27/14 428/220 |
| 2013/0330137 | A1 | 12/2013 | Mecklenburg | |

FOREIGN PATENT DOCUMENTS

| | | |
|---|---|---|
| CN | 103801718 A | 5/2014 |
| DE | 102010038077 | 4/2012 |
| EP | 0709483 A | 5/1996 |
| JP | 08-127863 A | 5/1996 |
| JP | 2011-513594 A | 4/2011 |
| JP | 2011-516722 A | 5/2011 |
| JP | 2011-224715 A | 11/2011 |
| JP | 2012-166294 A | 9/2012 |

OTHER PUBLICATIONS

Office Action mailed Jul. 18, 2016 for the corresponding Chinese Patent Application No. 201480019230.0.

* cited by examiner

SURFACE COATED CUTTING TOOL

CROSS-REFERENCE TO RELATED PATENT APPLICATIONS

This application is a U.S. National Phase Application under 35 U.S.C. §371 of International Patent Application No. PCT/JP2014/059648, filed Apr. 1, 2014, and claims the benefit of Japanese Patent Applications No. 2013-075856, filed Apr. 1, 2013 and No. 2014-070927, filed Mar. 31, 2014, all of which are incorporated herein by reference in their entireties. The International Application was published in Japanese on Oct. 9, 2014 as International Publication No. WO/2014/163081 under PCT Article 21(2).

FIELD OF THE INVENTION

The present invention relates to a surface coated cutting tool (hereinafter referred as "coated cutting tool") that exhibits an excellent cutting performance for a long-term usage by having a hard coating layer with an excellent chipping resistance during high-speed intermittent cutting work of alloy steel or the like in which high heat is generated and impacting load impinges on the cutting edge.

BACKGROUND OF THE INVENTION

Conventionally, the coated cutting tools, in which as a hard coating layer, a Ti—Al-based complex nitride layer is formed on the surface of the cutting tool body made of: tungsten carbide (hereinafter referred as WC)-based cemented carbide; titanium carbonitride (hereinafter referred as TiCN)-based cermet; or cubic boron nitride (hereinafter referred as cBN)-based ultra-high pressure sintered material (hereinafter collectively referred as "body"), by the physical vapor deposition method, are known. These coated cutting tools exhibit an excellent wear resistance.

However, various proposals have been made for improving the hard coating layer since unusual wear such as chipping or the like is prone to occur when coated cutting tools, on which the conventional Ti—Al-based complex nitride layer is formed, are used in high-speed intermittent cutting condition, even though they exhibit relatively excellent wear resistance.

For example, a configuration is proposed in Patent Literature 1 (PTL 1). In the configuration, a hard coating layer, which is made of the Ti and Al complex nitride satisfying $0.35 \leq x \leq 0.60$ (x is in atomic ratio) in the case where the Ti and Al complex nitride is expressed by the composition formula, $(Ti_{1-x}Al_x)N$, is formed on the surface of the cutting tool body by a physical vapor deposition method. In addition, the hard coating layer has an alternate laminated structure of the thin layer A, which is made of a granular crystal structure of the above-described (Ti, Al)N layer, and the thin layer B, which is made of a columnar crystal structure. In addition to the configuration described above: each of the thin layer A and the thin layer B has layer thickness of 0.05-2 μm; the crystal grain size of the granular crystal is set to 30 nm or less; and the crystal grain size of the columnar crystal is set to 50-500 nm. It is disclosed that the hard coating layer exhibits excellent chipping resistance, fracturing resistance, and peeling resistance in high-speed intermittent cutting work of high hardness steel by satisfying the configuration described above.

However, in this coated cutting tool, it is difficult to obtain the Al content ratio, x, to 0.6 or more since the hard coating layer is formed by a physical vapor deposition method. Thus, further improvement of cutting performance is still needed.

To meet the requirements, a technique, in which the Al content ratio, x, is increased to about 0.9 by forming the hard coating layer by a chemical vapor deposition method, has been proposed.

For example, it is described in Patent Literature 2 (PTL 2) that a $(Ti_{1-x}Al_x)N$ layer, the Al content ratio of which is 0.65-0.95, can be formed by performing a chemical vapor deposition in a temperature range of 650-900° C. in a mixed reaction gas of $TiCl_4$, $AlCl_3$, and $NH_3$. What is intended in PTL 2 is improving heat insulating effect by putting an extra coating of the $Al_2O_3$ layer on top of the $(Ti_{1-x}Al_x)N$ layer. Thus, PTL 2 is silent about any effect of forming the $(Ti_{1-x}Al_x)N$ layer with the increased x value to 0.65-0.95 on the cutting performance itself.

In addition, a configuration is proposed to improve heat resistance and fatigue strength of a coated cutting tool in Patent Literature 3 (PTL 3). In the configuration, a TiCN layer and an $Al_2O_3$ layer are provided as an inner layer. A $(Ti_{1-x}Al_x)N$ layer (x is 0.65-0.9), which is in a cubic crystal structure or a cubic crystal structure including a hexagonal crystal structure, is coated on the inner layer as an outer layer by a chemical vapor deposition method. In addition, compressive stress of 100-1100 MPa is given to the outer layer.

RELATED ART DOCUMENTS

Patent Literature

PTL 1: Japanese Unexamined Patent Application, First Publication No. 2011-224715 (A)

PTL 2: Published Japanese Translation No. 2011-516722 of the PCT International Publication (A)

PTL 3: Published Japanese Translation No. 2011-513594 of the PCT International Publication (A)

Problems to be Solved by the Present Invention

In recent years, there are strong demands for labor-saving and energy-saving in the cutting work. In responding to the demands, there is a tendency that the cutting work is performed at a higher speed and a higher efficiency. Thus, even higher unusual tool failures resistance, such as chipping resistance, fracturing resistance, peeling resistance, or the like, is required. At the same time, an excellent wear resistance for a long-term usage is required.

However, in the coated cutting tool described in PTL 1, it is difficult to increase the Al content ratio, x, since the hard coating layer made of the $(Ti_{1-x}Al_x)N$ layer is formed by the physical vapor deposition method. Thus, there is a technical problem that the coated cutting tool in PTL 1 does not have sufficient wear resistance and chipping resistance in the case where it is applied to high-speed intermittent cutting of alloy steel, for example.

In regard to the $(Ti_{1-x}Al_x)N$ layer described in PTL 2, which is formed by the chemical vapor deposition method, the Al content ratio, x, can be increased, and a cubic crystal structure can be formed. Thus, the hard coating layer with a hardness of a certain extent and an excellent wear resistance can be obtained. However, there is a technical problem that adhesion strength of the hard coating layer with the cutting tool body is not sufficient, and its toughness is inferior.

The coated cutting tool described in PTL 3 has a hardness of a certain extent and an excellent wear resistance. However, its toughness is inferior. Thus, in the case where it is applied to high-speed intermittent cutting of alloy steel or the like, unusual tool failure, such as chipping, fracturing, peeling, and the like, is prone to occur. Accordingly, there is a technical problem that the coated cutting tool described in PTL 3 does not exhibit a satisfactory cutting performance.

The technical problem to be solved by the present invention, which is the purpose of the present invention, is to provide a coated cutting tool that exhibits: an excellent toughness; an excellent chipping resistance; and an excellent wear resistance, for a long-term usage even if the coated cutting tool is applied to high-speed intermittent cutting of alloy steel or the like.

SUMMARY OF THE INVENTION

Means to Solving the Problems

In the light of the above-described viewpoint, the inventors of the present invention conducted an intensive study to improve chipping resistance and abrasion resistance of the coated cutting tool on which a hard coating layer including at least an Al and Ti complex nitride or complex carbonitride (occasionally referred as "(Ti, Al)(C,N)" or "$(Ti_{1-x}Al_x)(C_yN_{1-y})$") is formed by chemical vapor deposition. Then they obtained findings described below.

In the conventionally known hard coating layer, at least one $(Ti_{1-x}Al_x)(C_yN_{1-y})$ layer with a predetermined average layer thickness is included. In addition, the $(Ti_{1-x}Al_x)(C_yN_{1-y})$ layer is formed in a columnar crystal structure along with the direction perpendicular to the surface of the cutting tool body. In this case, the surface coated cutting tool with the conventional hard coating layer obtains a high wear resistance. On the other side of the coin, the higher the anisotropy in the crystal structure of the $(Ti_{1-x}Al_x)(C_yN_{1-y})$ layer, the lower the toughness of the $(Ti_{1-x}Al_x)(C_yN_{1-y})$ layer. As a result, chipping resistance and fracturing resistance of the surface coated cutting tool decrease, making it impossible for the coated cutting tool to exhibit a sufficient wear resistance for long-term usage. Also, the length of the tool life is not satisfactory.

Under the circumstances described above, the inventors of the present invention conducted an intensive study on the $(Ti_{1-x}Al_x)(C_yN_{1-y})$ layer which is a constituent of the hard coating layer. Then, they succeeded to improve hardness and toughness of the hard coating layer by introducing strain in cubic crystal grains based on the entirely novel idea, in which the $(Ti_{1-x}Al_x)(C_yN_{1-y})$ layer is constituted by a cubic crystal grain phase and a hexagonal crystal grain phase; and a periodic content ratio change of Ti and Al is formed in the cubic crystal grains. As a result, they found that a novel finding that the chipping resistance and the fracturing resistance of the hard coating layer can be improved.

Specifically, the hard coating layer of the surface coated cutting tool is configured as described below. The surface coated cutting tool has a hard coating layer including at least a Ti and Al complex nitride or carbonitride layer, which is formed by a chemical vapor deposition method. In the case where a composition of the complex nitride or carbonitride layer is expressed by a composition formula: $(Ti_{1-x}Al_x)(C_yN_{1-y})$, the content ratio x, which is the ratio of Al to the total amount of Ti and Al; and the content ratio y, which is the ratio of C to the total amount of C and N, satisfy $0.60 \leq x \leq 0.95$ and $0 \leq y \leq 0.005$, respectively (provided that each of x and y is in atomic ratio). In addition, crystal grains constituting the complex nitride or carbonitride layer includes cubic phase crystal grains; and hexagonal phase crystal grains, and the area ratio occupied by the cubic phase crystal grains is 30-80% in a plane perpendicular to the surface of the cutting tool body. In addition, in terms of the cubic phase crystal grains, the average grain width "W"; and the average aspect ratio "A", of the crystal grains with the cubic grain structure are 0.05-1.0 μm; and 5 or less, respectively. The average grain width "W" is the average value of the grain width "w" obtained with respect to individual cubic crystal grains. The grain width "w" is the width of the cubic crystal grains in the surface parallel to the surface of the cutting tool body. The average aspect ratio "A" is the average value of the aspect ratio "a" obtained with respect to individual cubic crystal grains. The aspect ratio "a" is the ratio of "1" to "w", "1/w", in which "1" is the length of the cubic grains in the direction perpendicular to the surface of the cutting tool body. Finally, the periodic content ratio change of Ti and Al in the composition formula: $(Ti_{1-x}Al_x)(C_yN_{1-y})$ exists in each of the cubic phase crystal grains, and the difference obtained by subtracting the local minimum value from the local maximum value of "x" in the periodic content ratio change is 0.05-0.25. The inventors of the present invention found that by having the configurations described above: strain is introduced in the cubic crystal grains; hardness and toughness of the $(Ti_{1-x}Al_x)(C_yN_{1-y})$ layer are improved compared to the conventional hard coating layer; the chipping resistance and the fracturing resistance of the hard coating layer are improved eventually; and the coated cutting tool exhibits an excellent wear resistance for a long-term usage.

The $(Ti_{1-x}Al_x)(C_yN_{1-y})$ layer configured as explained above can be formed by the chemical vapor deposition method described below, for example. In the chemical vapor deposition method, trimethyl aluminum $(Al(CH_3)_3)$ is included in the reaction gas component.

(a) Layer Forming Process

A $(Ti_{1-x}Al_x)(C_yN_{1-y})$ layer with a predetermined intended layer thickness is formed by performing a thermal CVD method on the surface of the cutting tool body for a predetermined time in the condition of: the reaction gas composition (volume %) including 0.5-1.5% of $TiCl_4$, 0-2.0% of $Al(CH_3)_3$, 1.5-2.5% of $AlCl_3$, 1.0-3.0% of $NH_3$, 11-15% of $N_2$, 0-0.5% of $C_2H_4$, and the balance $H_2$; the pressure of the reaction atmosphere of 2.0-5.0 kPa; and the temperature of the reaction atmosphere of 700-900° C.

(b) Etching Process

The $TiCl_4$ etching process of a predetermined lapse time is inserted predetermined times in the above-described coating process. The $TiCl_4$ etching process is performed in the condition of: the gas composition (volume %) including 2.0-5.0% of $TiCl_4$, and the balance $H_2$; the pressure of the reaction atmosphere of 2.0-5.0 kPa; and the temperature of the reaction atmosphere of 700-900° C.

By switching to the $TiCl_4$ etching process in the coating process as described above, the cubic TiAlCN is etched selectively; and composition difference of Ti and Al is formed locally in the crystal grains. Then, in order to stabilize the state, rearrangement of atoms occurs, causing the periodic change of the compositions. The inventors of the present inventions found that toughness is drastically improved accordingly by this. As a result, the inventors of the present invention found that the fracturing resistance and the chipping resistance are improved particularly; and the hard coating layer exhibits an excellent cutting performance for a long-term usage even if it is used for high-speed intermittent cutting work of steel alloy or the like in which intermittent and impacting load impinges on the cutting edge.

The present invention is made based on the finding described above, and has aspects shown below.

(1) A surface coated cutting tool including: a cutting tool body made of any one of tungsten carbide-based cemented carbide, titanium carbonitride-based cermet, and cubic boron nitride-based ultra-high pressure sintered material; and a hard coating layer provided on a surface of the cutting tool body, wherein the hard coating layer includes at least a Ti and Al complex nitride or carbonitride layer, which is formed by a chemical vapor deposition method and has an average layer thickness of 1 to 20 μm, in a case where a composition of the complex nitride or carbonitride layer is expressed by a composition formula: $(Ti_{1-x}Al_x)(C_yN_{1-y})$, a content ratio x, which is a ratio of Al to a total amount of Ti and Al; and a content ratio y, which is a ratio of C to a total amount of C and N, satisfy $0.60 \leq x \leq 0.95$ and $0 \leq y \leq 0.005$, respectively, provided that each of x and y is in atomic ratio, crystal grains constituting the complex nitride or carbonitride layer includes cubic phase crystal grains; and hexagonal phase crystal grains, an area ratio occupied by the cubic phase crystal grains is 30-80% in a plane perpendicular to the surface of the cutting tool body, an average grain width W; and an average aspect ratio A of the crystal grains with the cubic grain structure are 0.05-1.0 μm; and 5 or less, respectively, a periodic content ratio change of Ti and Al in the composition formula: $(Ti_{1-x}Al_x)(C_yN_{1-y})$ exists in each of the cubic phase crystal grains, and a difference obtained by subtracting a local minimum value x from a local maximum value x in the periodic content ratio change is 0.05-0.25.

(2) The surface coated cutting tool according to (1) described above, wherein in the cubic phase crystal grains having the periodic content ratio change of Ti and Al in the complex nitride or carbonitride layer:

the periodic content ratio change of Ti and Al is aligned along with a direction belonging to equivalent crystal directions expressed by <001> in a cubic crystal system;

a period along the direction is 3-30 nm; and a change of content ratio x of Ti and Al in a plane perpendicular to the direction is 0.01 or less.

(3) The surface coated cutting tool according to (1) described above, wherein in the cubic phase crystal grains having the periodic content ratio change of Ti and Al in the complex nitride or carbonitride layer:

a region A and a region B exist; and a boundary of the region A and region B is formed in a crystal plane belonging to equivalent crystal planes expressed by {110}, wherein (a) the region A is a region, in which the periodic content ratio change of Ti and Al is aligned along with a direction belonging to equivalent crystal directions expressed by <001> in a cubic crystal system; and in a case where the direction is defined as a direction $d_A$, a period along the direction $d_A$ is 3-30 nm and a change of content ratio x of Ti and Al in the plane perpendicular to the direction $d_A$ is 0.01 or less; and (b) the region B is a region, in which the periodic content ratio change of Ti and Al is aligned along with a direction, which is perpendicular to the direction $d_A$, belonging to equivalent crystal directions expressed by <001> in a cubic crystal system; and in a case where the direction is defined as a direction $d_B$, a period along the direction $d_B$ is 3-30 nm and a change of content ratio x of Ti and Al in the plane perpendicular to the direction $d_B$ is 0.01 or less.

(4) The surface coated cutting tool according to any one of (1) to (3) described above, further including a lower layer between the cutting tool body made of any one of tungsten carbide-based cemented carbide, titanium carbonitride-based cermet, and cubic boron nitride-based ultra-high pressure sintered material; and the Ti and Al complex nitride or carbonitride layer, the lower layer includes a Ti compound layer, which is made of one or more layer selected from a group consisting of a Ti carbide layer; a Ti nitride layer; a Ti carbonitride layer; a Ti carbonate layer; and a Ti oxycarbonitride layer, and has an average total layer thickness of 0.1-20 μm.

(5) The surface coated cutting tool according to any one of (1) to (4) described above, further including an upper layer in an upper part of the complex nitride or carbonitride layer, the upper layer includes at least an aluminum oxide layer with an average layer thickness of 1-25 μm.

(6) The surface coated cutting tool according to any one of (1) to (5) described above, the complex carbonitride layer is formed by a chemical vapor deposition method, a reaction gas component of which includes at least trimethyl aluminum.

Having the complex nitride or carbonitride layer is the essential configuration of the hard coating layer in the cutting tool, which is the aspect of the present invention. It is needless to say that an even more excellent property can be obtained by having the hard coating layer with the conventionally known, lower layer, the upper layer, or the like in cooperation with the technical effect of the complex nitride or the complex carbonitride layers.

The present invention is explained in detail below.

Average Layer Thickness of the Complex Nitride or Carbonitride Layer Constituting the Hard Coating Layer:

The hard coating layer included in the surface coated cutting tool of the present invention includes at least the chemically vapor deposited Ti and Al complex nitride or carbonitride layer represented by the composition formula $(Ti_{1-x}Al_x)(C_yN_{1-y})$. The complex nitride or carbonitride layer has a high hardness and an excellent wear resistance. In particular, when the average total layer thickness of the Ti and Al complex nitride or carbonitride layer is 1-20 μm, the advantageous effect is distinctly exerted. The reason for this is that: if the average layer thickness was less than 1 μm, it would be impossible to obtain sufficient wear resistance for a long-term usage since the layer thickness is too thin; and if the average layer thickness exceeded 20 μm, it would be prone to be chipped since the crystal grain size of the Ti and Al complex nitride or carbonitride layer tends to be coarse. Therefore, the average total layer thickness of the complex carbonitride layer is set to 1-20 μm.

Composition of the Complex Nitride or Carbonitride Layer Constituting the Hard Coating Layer:

In the complex nitride or carbonitride layer constituting the hard coating layer included in the surface coated cutting tool of the present invention, the content ratio x, which is the ratio of Al to the total amount of Ti and Al; and the content ratio y, which is the ratio of C to a total amount of C and N, are adjusted to satisfy $0.60 \leq x \leq 0.95$ and $0 \leq y \leq 0.005$, respectively (provided that any one of x and y is in atomic ratio).

The reason for that is that if the Al content ratio x were less than 0.60, hardness of the Ti and Al complex nitride or carbonitride layer would be inferior. Thus, in the case where it is applied to high-speed intermittent cutting of steel alloy or the like, abrasion resistance is insufficient. Contrary to that, if the Al content ratio x exceeded 0.95, the Ti content would be relatively reduced, which leads to embrittlement of the material and abrasion resistance is reduced. Because of the reason described above, the Al content ratio x is set to $0.60 \leq x \leq 0.95$.

In addition, when the C content ratio (in atomic ratio) y included in the complex nitride or carbonitride layer is extremely small amount in the range of $0 \leq y \leq 0.005$, adhesiveness of the complex nitride or carbonitride layer to the cutting tool body or the lower layer is improved; and lubricity is also improved. Because of these, impact during cutting is alleviated. As a result, fracturing resistance and chipping resistance of the complex nitride or carbonitride layer are improved. On the other hand, having the C content ratio y out of the range of $0 \leq y \leq 0.005$ is unfavorable since toughness of the complex nitride or carbonitride layer is reduced, which leads to adversely reduced fracturing resistance and chipping resistance. Because of the reason described above, the C content ratio y is set to $0 \leq y \leq 0.005$.

Cubic Crystal Grains Constituting the Complex Nitride or Carbonitride Layer:

The average grain width W is adjusted to satisfy 0.05-1.0 μm. The average aspect ratio A is adjusted to satisfy being less than 5. The average aspect ratio A is the average value of aspect ratios "a" obtained relative to individual crystal grains. The average grain width W is the average value of grain widths "w" obtained relative to individual crystal grains. The aspect ratio "a" is the ratio of "l" to "w", l/w, of each crystal grain. The crystal grain width "w" is the crystal grain width in the direction parallel to the surface of the cutting tool body with respect to each cubic crystal grain in the complex nitride or carbonitride layer. Similarly, the crystal grain length is the crystal grain length in the direction perpendicular to the surface of the cutting tool body with respect to each cubic crystal grains in the complex nitride or carbonitride layer.

When this condition is satisfied, the cubic crystal grains constituting the complex nitride or carbonitride layer become the granular structure and show excellent abrasion resistance. Contrary to that, it is unfavorable to have the average aspect ratio exceeding 5 since the crystal grains become the columnar structure, making it difficult to form the periodic concentration change of composition, which is one of unique features of the present invention, in the cubic crystal phase. In addition, when the average grain width W is less than 0.05 μm, abrasion resistance is reduced. When it exceeds 1.0 μm, toughness is reduced. Because of the reason described above, the average grain width W of the cubic crystal grains constituting the complex nitride or carbonitride layer is set to 0.05-1.0 μm.

Area Ratio Occupied by the Cubic Crystal Phase in the Crystal Grains:

More preferably, in the case where the crystal direction of each of crystal grains is analyzed in the vertical cross section (plane perpendicular to the surface of the cutting tool body) direction of the Ti and Al complex nitride or carbonitride layer using an electron backscatter diffraction apparatus (EBSD): both of: the cubic crystal phase, in which the electron backscatter diffraction pattern of the cubic crystal lattice is observed; and the hexagonal crystal phase, in which the electron backscatter diffraction pattern of the hexagonal crystal lattice is observed, are detected; and the area ratio of the cubic crystal phase relative to the total area of the cubic crystal phase and the hexagonal crystal phase is in the range 30-80 area %. When the area ratio occupied by the cubic crystal grains in the all crystal grains is less than 30 area %, hardness is reduced. As a result, abrasion resistance is reduced. On the other hand, when it exceeds 80 area %, toughness is reduced. As a result, chipping resistance is reduced. Because of the reason described above, the area ratio occupied by the cubic crystal grains in the all crystal grains is set to 30-80 area %.

Basically, the above-described Ti and Al complex nitride or carbonitride layer is made of the cubic phase and hexagonal phase crystal grains. However, the Ti and Al complex nitride or carbonitride layer may include an amorphous phase that is formed inevitably to a small extent additionally. In this case, the area ratio occupied by the amorphous phase relative to the total area occupied by the cubic phase and hexagonal phase crystal grains is 10% or less in the vertical cross section of the Ti and Al complex nitride or carbonitride layer.

Content Ratio Change of Ti and Al Existing in the Cubic Phase Crystal Grain:

In the case where the composition of the cubic phase crystal is expressed by the composition formula $(Ti_{1-x}Al_x)(C_yN_{1-y})$, when a periodic content ratio change of Ti and Al exists in the cubic crystal grain, strain is introduced in the cubic crystal grain and hardness is improved. However, when the difference obtained by subtracting the local minimum value from the local maximum value of "x", which is an index of the extent of the content ratio change of Ti and Al, in the above-described composition formula is less than 0.05, the above-described strain in the cubic crystal grain is lowered, and sufficient improvement of hardness cannot be expected. On the other hand, when the difference obtained by subtracting the local minimum value from the local maximum value of "x" exceeds 0.25, strain in the cubic crystal grain becomes too high, which leads to a larger lattice defect and lowered hardness. Because of the reason described above, in terms of the content ratio change of Ti and Al existing in the cubic phase crystal grains, the difference obtained by subtracting the local minimum value from the local maximum value of x that periodically changes is set to 0.05-0.25. In addition, in the case where the periodic content ratio change of Ti and Al is aligned along with a direction belonging to equivalent crystal directions expressed by <001> in a cubic crystal system, it becomes harder for a lattice defect due to strain in the crystal grain to be formed; and toughness is improved in the cubic phase crystal grains, in which the periodic content ratio change of Ti and Al exists in the complex nitride or carbonitride layer. In addition, the content ratios of Ti and Al are not changed substantially in the plane perpendicular to the direction in which the above-described periodic content ratio change of Ti and Al exists. In addition, when the period of the content ratio change along with a direction belonging to equivalent crystal directions expressed by <001> in a cubic crystal system is less than 3 nm, toughness is reduced. When it exceeds 30 nm, the effect of the hardness improvement cannot be expected. Because of the reason described above, the period of the content ratio change is set to 3-30 nm. In addition, in terms of the crystal grain in which two periodic content ratio changes of Ti and Al in two directions at right angles to each other exist in the crystal grain as the region A and the region B, toughness is improved further because of the existence of strain in two directions in the crystal grain. Moreover, high toughness can be maintained since misfit in the boundary between the region A and the region B does not occur because the boundary between the region A and the region B is formed in a crystal plane belonging to equivalent crystal planes expressed by {110}.

For the periodic content ratio change of Ti and Al to exist in the crystal grain means that the value x rises and falls in the range of 0.05-0.25 in a constant period width of 3-30 nm in the case where the ratios of Ti and Al in the crystal grain is defined by the value x of $(Ti_{1-x}Al_x)$. It also means that at least 5 sets or more of the periods exist in a crystal grain in the case where the continuous one rising and one falling of the value x is defined as one set of the period.

Also, when the complex nitride or carbonitride layer in the coated cutting tool of the aspect of the present invention includes the Ti compound layer as the lower layer; the Ti compound layer is made of one layer or more than two layers selected from the group consisting of Ti carbide layer, Ti nitride layer, Ti carbonitride layer, Ti carbonate layer, and Ti oxycarbonitride layer; and the average total thickness of the Ti compound layer is 0.1 to 20 μm, and/or when the complex carbonitride layer includes aluminum oxide layer with the average thickness of 1-25 μm as the upper layer, the above-mentioned properties are not deteriorated. Rather, by combining the complex nitride or carbonitride layer with these conventionally known lower layer and upper layer, even more superior property can be created in cooperation with the technical effect of these layers. In the case where the Ti compound layer, which is made of one or more layers of a Ti carbide layer, a Ti nitride layer, a Ti carbonitride layer, a Ti carbonate layer, and a Ti oxycarbonitride layer, is included as the lower layer, when the average total layer thickness of the Ti compound layer exceeds 20 μm, the crystal grain is prone to be coarse, and chipping is prone to occur. In addition, in the case where an aluminum oxide layer is included as the upper layer, when the average total thickness of the aluminum oxide layer exceeds 25 μm, the crystal grain is prone to be coarse, and chipping is prone to occur.

A drawing schematically illustrating the cross section of the Ti and Al complex nitride or carbonitride layer constituting the hard coating layer of the present invention is shown in FIG. 1.

Effects of the Invention

The surface coated cutting tool of the present invention includes: a cutting tool body 1 made of any one of tungsten carbide-based cemented carbide, titanium carbonitride-based cermet, and cubic boron nitride-based ultra-high pressure sintered material; and a hard coating layer 2 provided on a surface of the cutting tool body 1. In the surface coated cutting tool of the present invention, the hard coating layer 2 includes at least a Ti and Al complex nitride or carbonitride layer, which is formed by a chemical vapor deposition method. In the case where a composition of the complex nitride or carbonitride layer is expressed by a composition formula: $(Ti_{1-x}Al_x)(C_yN_{1-y})$, a content ratio x, which is a ratio of Al to a total amount of Ti and Al; and a content ratio y, which is a ratio of C to a total amount of C and N, satisfy $0.60 \leq x \leq 0.95$ and $0 \leq y \leq 0.005$, respectively, provided that each of x and y is in atomic ratio. Crystal grains constituting the complex nitride or carbonitride layer includes cubic phase crystal grains; and hexagonal phase crystal grains. The area ratio occupied by the cubic phase crystal grains is 30-80% in the plane perpendicular to the surface of the cutting tool body 1. The average grain width W; and an average aspect ratio A of the crystal grains with the cubic grain structure are 0.05-1.0 μm; and 5 or less, respectively. The periodic content ratio change of Ti and Al in the composition formula: $(Ti_{1-x}Al_x)(C_yN_{1-y})$ exists in each of the cubic phase crystal grains, and the difference obtained by subtracting a local minimum value x from a local maximum value x in the periodic content ratio change is 0.05-0.25. By having the above-described configurations, strain is introduced in the cubic phase crystal grain. Because of this, hardness of the crystal grain is improved; and toughness is also improved, while keeping the high abrasion resistance. As a result, the chipping resistant improvement effect is exhibited; the coated cutting tool exhibits excellent cutting performance for a long-term usage compared to the conventional hard coating layer 2; and the longer service life of the coated cutting tool is achieved.

DETAILED DESCRIPTION OF THE INVENTION

Figure 1:
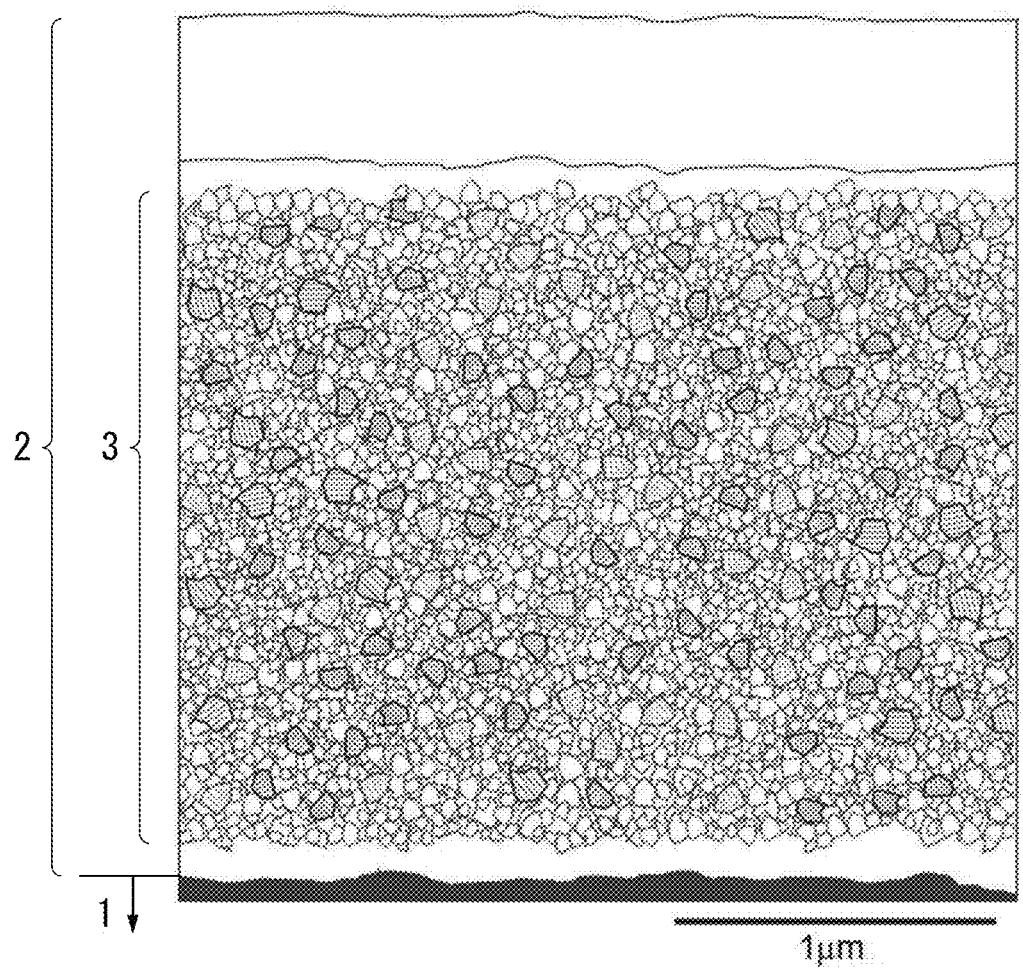
FIG. 1 is a diagram of the layer constitution showing the cross section of the Ti and Al complex nitride or carbonitride layer constituting the hard coating layer 2 in the present invention schematically.
Figure 2:
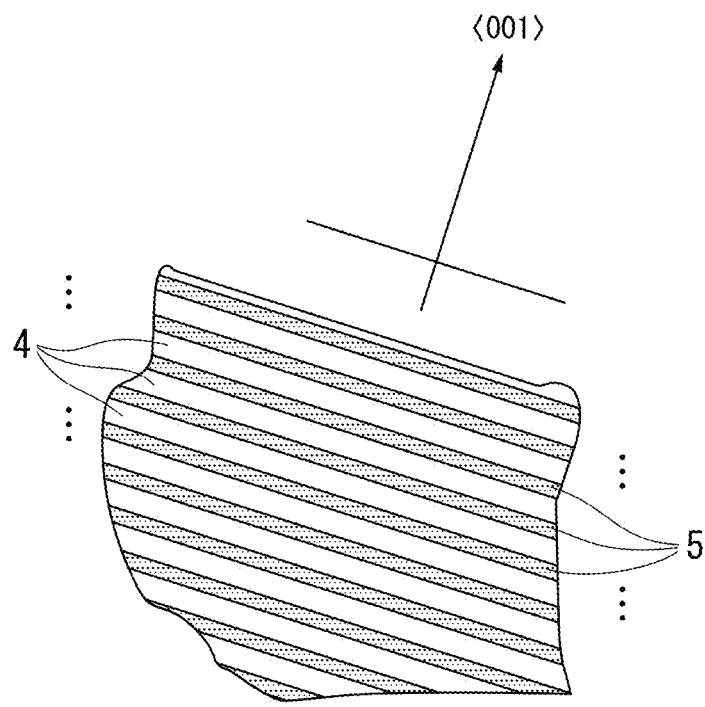
FIG. 2 is a diagram schematically showing: the periodic content ratio change of Ti and Al is aligned along with a direction belonging to equivalent crystal directions expressed by <001> in a cubic crystal system; and the content ratio change of Ti and Al in the plane perpendicular to the direction is minimum, in regard to the cubic phase crystal grains, in which the periodic content ratio change of Ti and Al exists, in the cross section of the Ti and Al complex nitride or carbonitride layer 3 constituting the hard coating layer 2 corresponding to the first embodiment of the present invention.
Figure 3:
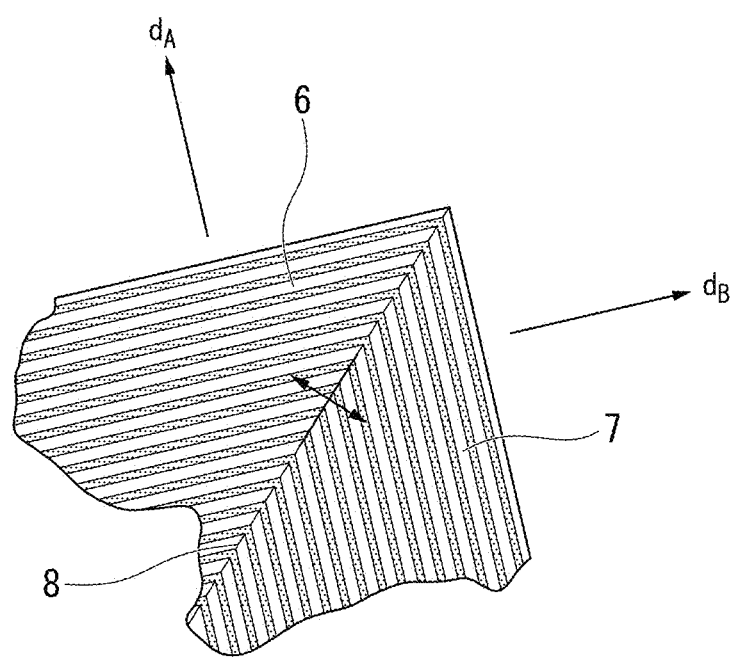
FIG. 3 is a diagram schematically showing that the region A and region B exist in the crystal grain, in regard to the cubic phase crystal grains, in which the periodic content ratio change of Ti and Al exists, in the cross section of the Ti and Al complex nitride or carbonitride layer 3 constituting the hard coating layer 2 corresponding to the first embodiment of the present invention.
Figure 4:
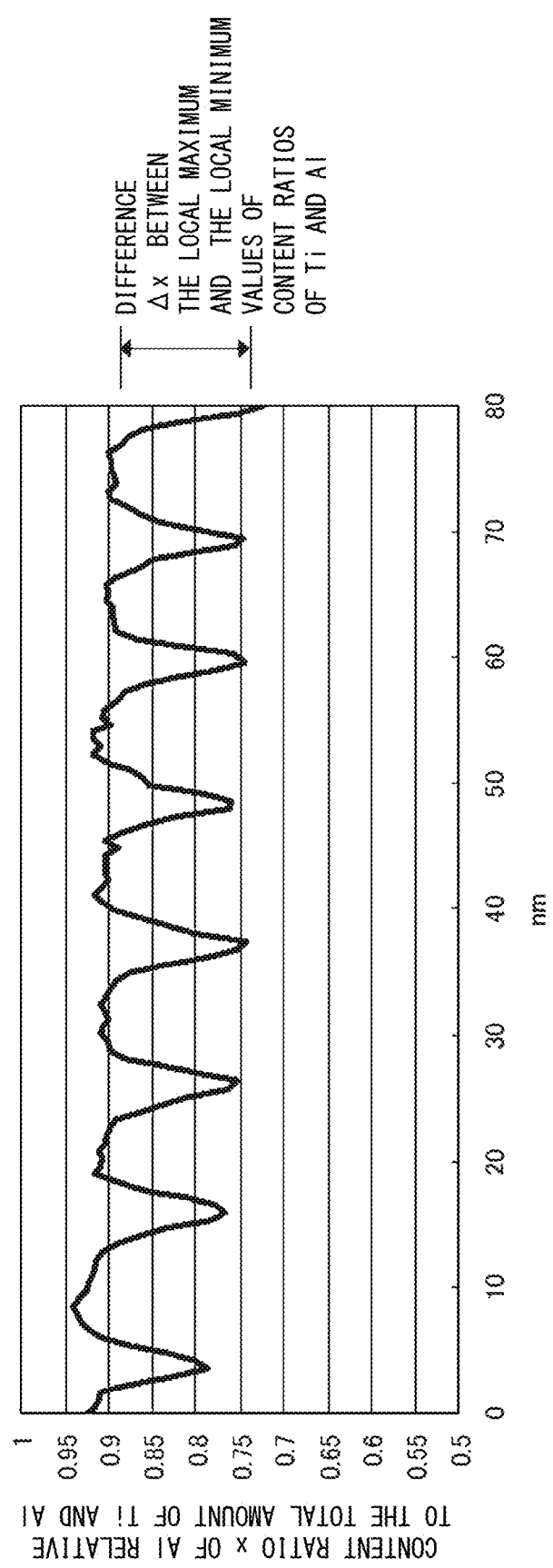
FIG. 4 shows an example of a graph of the periodic content ratio change x of Ti and Al based on results obtained by performing the line analysis by the energy dispersive X-ray spectroscopy method (EDS) by using a transmission electron microscope.

Next, the coated cutting tool of the present invention is explained specifically by Examples.

Example 1

As raw material powders, the WC powder, the TiC powder, the ZrC powder, the TaC powder, the NbC powder, the $Cr_3C_2$ powder, and the Co powder, all of which had the average grain sizes of 1-3 μm, were prepared. These raw material powders were blended in the blending composition shown in Table 1. Then, wax was added to the blended mixture, and further mixed in acetone for 24 hours with a ball mill. After drying under reduced pressure, the mixtures were press-molded into green compacts with a predetermined shape under pressure of 98 MPa. Then, the obtained green compacts were sintered in vacuum in the condition of 5 Pa vacuum at the predetermined temperature in the range of 1370-1470° C. for 1 hour retention. After sintering, the cutting tool bodies A-C, which had the insert-shape defined by ISO-SEEN1203AFSN and made of WC-based cemented carbide, were produced.

Also, as raw material powders, the TiCN powder (TiC/TiN=50/50 in mass ratio), the $Mo_2C$ powder, the ZrC powder, the NbC powder, the WC powder, the Co powder, and the Ni powders, all of which had the average grain sizes of 0.2-2 µm, were prepared. These raw material powders were blended in the blending composition shown in Table 2. Then, with a ball mill, the obtained mixtures were subjected to wet-mixing for 24 hours. After drying, the mixtures were press-molded into green compacts under pressure of 98 MPa. The obtained green compacts were sintered in the condition of: in nitrogen atmosphere of 1.3 kPa; at a temperature of 1500° C.; and for 1 hour of the retention time. After sintering, the cutting tool body D, which had the insert-shape defined by ISO-SEEN1203AFSN and made of TiCN-based cermet, was produced.

Next, the coated cutting tools of the present invention 1-15 were produced by performing following the processes (a)-(c) explained below.

(a) The $(Ti_{1-x}Al_x)(C_yN_{1-y})$ layer in the granular structure, which has the average grain width W and the average grain length L shown in Table 6, is formed on the surfaces of the cutting tool bodies A-D using a standard chemical vapor deposition apparatus by performing a thermal CVD for a predetermined time in the formation conditions A-J shown in Table 4. In the formation conditions A-J, the reaction gas composition (volume %) includes: 0.5-1.5% of $TiCl_4$; 0-2.0% of $Al(CH_3)_3$; 1.5-2.5% of $AlCl_3$; 1.0-3.0% of $NH_3$; 11-15% of $N_2$; 0-0.5% of $C_2H_4$; and the $H_2$ balance. The pressure of the reaction atmosphere is 2.0-5.0 kPa. The temperature of the reaction atmosphere is 700-900° C. (Layer forming process).

(b) In the coating process (a), the $TiCl_4$ etching process for a predetermined lapse time is inserted predetermined multiple times in the formation conditions a-j shown in Table 4. In the formation conditions a-j, the reaction gas composition (volume %) includes: 2.0-5.0 of $TiCl_4$; and the $H_2$ balance. The pressure of the reaction atmosphere is 2.0-5.0 kPa. The temperature of the reaction atmosphere is 700-900° C. (Etching process).

(c) By inserting the etching process made of (b) for the predetermined time; and the predetermined repeating number shown in Table 6 in the above-described coating process (a), the hard coating layer made of the granular-structured $(Ti_{1-x}Al_x)(C_yN_{1-y})$ layer with the intended layer thickness shown in Table 6, in which the cubic phase and hexagonal phase crystal grains presented, was formed; and the coated cutting tools of the present invention 1-15 were produced.

In regard to the coated cutting tools of the present invention 6-13, the lower layer as shown in Table 5 and/or the upper layer were formed as shown in Table 6 in the forming condition shown in Table 3.

In regard to the Ti and Al complex nitride or carbonitride layer constituting the hard coating layers of the coated cutting tools of the present invention 1-15, multiple fields of view were observed by using a scanning electron microscope (magnifying power: ×5000 to ×20000). In the observation, the presence of the granular-structured $(Ti_{1-x}Al_x)(C_yN_{1-y})$ layer in which the cubic phase and hexagonal phase crystal grains existed, was confirmed as indicated in the schematic diagram of the layer constitution shown in FIG. 1. In addition, existence of the periodic concentration change of Ti and Al in the cubic crystal grain was confirmed by the plane analysis by the energy dispersive X-ray spectroscopy method (EDS) by using a transmission electron microscope (magnifying power: ×20000). In addition, by further analyzing, it was confirmed that the difference obtained by subtracting the local minimum value from the local maximum value of x was in the range of 0.05-0.25.

In addition, in regard to the complex nitride or carbonitride layer, when the crystal structure of the individual crystal grains was analyzed in the vertical cross section direction of the Ti and Al complex nitride or carbonitride layer using the electron backscatter diffraction apparatus, it was confirmed that the layer was a mixed structure of: the cubic crystal phase, in which the electron backscatter diffraction pattern of the cubic crystal lattice was observed; and the hexagonal crystal phase, in which the electron backscatter diffraction pattern of the hexagonal crystal lattice was observed. In addition, it was confirmed that the area ratio occupied by the cubic crystal phase relative to the total of the cubic and hexagonal crystal phases whose electron backscatter diffraction patterns were observed, was 30-80 area %.

In addition, for a comparison purpose, the hard coating layers including at least a Ti and Al complex nitride or carbonitride layer were formed by vapor deposition of the surface of the cutting tool bodies A-D, in the conditions shown in Tables 3 and 4; and in the intended total layer thicknesses (µm) shown in Table 7 as in the coated cutting tools of the present invention 1-15. At this time, the comparative coated cutting tools 1-13 were produced by forming the hard coating layer without inserting the etching process in the coating process of the $(Ti_{1-x}Al_x)(C_yN_{1-y})$ layer.

As in the coated cutting tools 6-13 of the present invention, in regard to the comparative coated cutting tools 6-13, the lower layer shown in Table 5 and/or the upper layer shown in Table 7 were formed in the forming condition shown in Table 3.

For purpose of reference, the reference coated cutting tools 14 and 15 shown in Table 7 were produced by forming the $(Ti_{1-x}Al_x)(C_yN_{1-y})$ layer of the reference example on the surface of the cutting tool body B and cutting tool body C in the intended layer thickness with a standard physical vapor deposition by arc-ion plating.

The conditions for the arc-ion plating for vapor deposition of the reference examples were as explained below.

(a) The bodies B and C were subjected to ultrasonic cleaning in acetone. Then, the cleaned tool bodies B and C in a dried state were set along the outer peripheral part in positions spaced away from the central axis in a predetermined distance in the radius direction on the rotating table in the arc-ion plating apparatus. As the cathode electrode (vaporization source), an Al—Ti alloy with a predetermined composition was placed.

(b) Inside of the apparatus was heated to 500° C. by a heater while retaining vacuum less than $10^{-2}$ Pa by exhausting atmosphere in the apparatus. Then, direct current bias voltage of −1000V was applied to the bodies rotating and orbiting on the rotation table. At the same time, arc discharge was generated by flowing current of 200 A between the cathode electrode made of the Al—Ti alloy and the anode electrode. By following the procedure described above, Al and Ti ions were formed in the apparatus to perform bombard treatment on the surfaces of the tool bodies.

(c) Next, direct current bias voltage of −50V was applied to the tool bodies rotating and orbiting on the rotating table while turning the atmosphere in the apparatus to the reaction atmosphere of 4 Pa by introducing nitrogen gas as a reaction gas in the apparatus. At the same time, arc discharge was generated by flowing current of 120 A between the cathode electrode (vaporization source) made of the Al—Ti alloy and the anode electrode. By following above-described procedure, the (Ti, Al)N layers with the intended compositions and the intended layer thicknesses shown in Table 7 were formed on the surfaces of the bodies by vapor deposition and the coated cutting tools of the reference example 14 and 15 were produced.

The cross sections of each constituent layer of: the coated cutting tools of the present invention 1-15; the comparative coated cutting tools 1-13; and the reference coated cutting tools 14 and 15, were measured by using a scanning electron microscope (magnifying power: ×5000). The average layer thicknesses were obtained by averaging layer thicknesses measured at 5 points within the observation viewing field. In any measurement, the obtained layer thickness was practically the same as the intended layer thicknesses shown in Tables 6 and 7.

In regard to the average Al content ratio, x, of the complex nitride layer or the complex carbonitride layer, an electron beam was irradiated to the polished surface of the samples from the surface side of the sample by using EPMA (Electron-Probe-Micro-Analyzer). Then, the average Al content ratio, x, was obtained from 10-point average of the analysis results of the characteristic X-ray. The average C content ratio, y, was obtained by secondary-ion-mass-spectroscopy (SIMS). An ion beam was irradiated on the range of 70 µm×70 µm from the front surface side of the sample. In regard to the components released by sputtering effect, content ratio measurement in the depth direction was performed. The average C content ratio, y, indicates the average value in the depth direction of the Ti and Al complex nitride layer or the Ti and Al complex carbonitride layer.

In regard to the coated cutting tools of the present invention 1-15; the comparative coated cutting tools 1-13; and the reference coated cutting tools 14 and 15, the average aspect ratio A and the average grain width W were obtained as explained below. In regard to the individual crystal grains in the granular structured $(Ti_{1-x}Al_x)(C_yN_{1-y})$ layer constituting the complex nitride or carbonitride layer existing in the length range of 10 µm horizontal to the surface of the cutting tool body, the grain width "w" parallel to the surface of the cutting tool body; and the grain length "l" perpendicular to the surface of the cutting tool body were measured by using a scanning electron microscope (magnifying power: ×5000 and ×20000). Then, the aspect ratio "a" (=l/w) of each of the individual crystal grains were calculated; and the average aspect ratio A was obtained as the average value of the aspect ratios "a." The average grain width W was obtained as the average value of the grain widths "w" obtained from each of the crystal grains. The measurement results are shown in Tables 6 and 7.

In the condition where the cross section of the hard coating layer, which was made of the Ti and Al complex nitride or carbonitride layer, in the perpendicular direction to the surface of the cutting tool body was polished to be a polished surface, the area ratio occupied by the cubic crystal phase in the crystal grains constituting the Ti and Al complex nitride or carbonitride layer was obtained: by setting the sample in the lens barrel of the electron backscatter diffraction apparatus; by irradiating an electron beam to each crystal grain existing within the measurement range in the above-described polished surface of the cross section in the condition where the angle of incidence was 70°, the accelerating voltage was 15 kV, and the irradiation current was 1 nA; by measuring the electron backscatter diffraction pattern in the length of 100 µm in the direction horizontal to the cutting tool body at the interval of 0.01 µm/step in the hard coating layer; and by identifying whether each of crystals was in the cubic crystal phase or in the hexagonal crystal phase by analyzing the crystal structure of each crystal grain, by using an electron backscatter diffraction apparatus. The results are shown in Tables 6 and 7 in the same manner.

In addition, observation of the micro region of the complex nitride or carbonitride layer was performed by using a transmission electron microscope (magnifying power: ×20000); and the plane analysis from the cross section side was performed by using the energy dispersive X-ray spectroscopy method (EDS). By these observation and analysis, existence of the periodic content ratio change of Ti and Al in the composition formula $(Ti_{1-x}Al_x)(C_yN_{1-y})$ was confirmed in the cubic phase crystal grain. In addition, by performing electron diffraction to the crystal grain, it was confirmed that the periodic content ratio change of Ti and Al is aligned along with a direction belonging to equivalent crystal directions expressed by <001> in a cubic crystal system. In addition, the difference obtained by subtracting the local minimum value from the local maximum value of the content ratio of Ti and Al, x, was obtained as change of the content ratio of Ti and Al, x, by performing the line analysis by EDS along with the direction; by obtaining the difference of each of the average values of the local maximum values and the local minimum values of the periodic content ratio change of Ti and Al as the difference Δx between the local maximum value and the local minimum value; by obtaining the period of the local maximum values as the period of the periodic content ratio change of Ti and Al; and performing the line analysis along with the direction perpendicular the direction. In regard to the crystal grain in which the region A and the region B exist in the crystal grain, it was confirmed that the direction $d_A$ and the direction $d_B$ were orthogonal each other; and the boundary of the region A and region B was formed in a crystal plane belonging to equivalent crystal planes expressed by {110}, in the case where the periodic content ratio change of Ti and Al is aligned along with a direction belonging to equivalent crystal directions expressed by <001> in the region A, and the direction is defined as the direction $d_A$; and the periodic content ratio change of Ti and Al is aligned along with a direction belonging to equivalent crystal directions expressed by <001> in the region B, and the direction is defined as the direction $d_B$. The confirmation was done by obtaining the difference Δx between the maximum and local minimum values of the periodic content ratio change of Ti and Al; the period; and the content ratio change in the planes orthogonal each other as explained above to the region A and the region B.

TABLE 1

| | | Blending composition (mass %) | | | | | |
|---|---|---|---|---|---|---|---|
| Type | | Co | TiC | TaC | NbC | $Cr_3C_2$ | WC |
| Cutting tool body | A | 8.0 | 1.5 | — | 3.0 | 0.4 | balance |
| | B | 8.5 | — | 1.8 | 0.2 | — | balance |
| | C | 7.0 | — | — | — | — | balance |

TABLE 2

| | | Blending composition (mass %) | | | | | | |
|---|---|---|---|---|---|---|---|---|
| Type | | Co | Ni | ZrC | NbC | $Mo_2C$ | WC | TiCN |
| Cutting tool body | D | 8 | 5 | 1 | 6 | 6 | 10 | balance |

TABLE 3

| Constituting layer of the hard coating layer | | | Formation condition (pressure and temperature of the reaction atmosphere is in kPa and °C., respectively) | | |
|---|---|---|---|---|---|
| | | Formation | | Reaction atmosphere | |
| Type | | symbol | Reaction gas composition (volume %) | Pressure | Temperature |
| $(Ti_{1-x}Al_x)(C_yN_{1-y})$ layer | TiAlCN | TiAlCN | refer Table 4 | 7 | 1000 |
| Ti compound layer | TiC | TiC | $TiCl_4$: 4.2%, $CH_4$: 8.5%, $H_2$: balance | 7 | 1020 |
| | TiN | TiN-1 | $TiCl_4$: 4.2%, $N_2$: 30%, $H_2$: balance | 30 | 900 |
| | | TiN-2 | $TiCl_4$: 4.2%, $N_2$: 35%, $H_2$: balance | 50 | 1040 |
| | | TiN-3 | $TiCl_4$: 4.2%, $N_2$: 30%, $H_2$: balance | 30 | 780 |
| | l-TiCN | l-TiCN-1 | $TiCl_4$: 2%, $CH_3CN$: 0.7%, $N_2$: 10%, $H_2$: balance | 7 | 900 |
| | | l-TiCN-2 | $TiCl_4$: 2%, $CH_3CN$: 0.7%, $N_2$: 10%, $H_2$: balance | 7 | 780 |
| | TiCN | TiCN | $TiCl_4$: 2%, $CH_4$: 1%, $N_2$: 15%, $H_2$: balance | 13 | 1000 |
| | TiCO | TiCO | $TiCl_4$: 4.2%, CO: 4%, $H_2$: balance | 7 | 1020 |
| | TiCNO | TiCNO | $TiCl_4$: 2%, CO: 1%, $CH_4$: 1%, $N_2$: 5%, $H_2$: balance | 13 | 1000 |
| $Al_2O_3$ layer | $Al_2O_3$ | $Al_2O_3$ | $AlCl_3$: 2.2%, $CO_2$: 5.5%, HCl: 2.2%, $H_2S$: 0.2%, $H_2$: balance | 7 | 1000 |

TABLE 4

| Formation of the hard coating layer | | Formation condition (pressure and temperature of the reaction atmosphere is in kPa and °C., respectively) | | |
|---|---|---|---|---|
| Process | Formation | Reaction gas composition | Reaction atmosphere | |
| type | symbol | (volume %) | Pressure | Temperature |
| Coating process | A | $TiCl_4$: 0.5%, $Al(CH_3)_3$: 2.0%, $AlCl_3$: 2.0%, $NH_3$: 2.0%, $N_2$: 11%, $C_2H_4$: 0%, balance $H_2$ | 3.5 | 800 |
| | B | $TiCl_4$: 1.0%, $Al(CH_3)_3$: 1.0%, $AlCl_3$: 2.0%, $NH_3$: 2.5%, $N_2$: 14%, $C_2H_4$: 0.5%, balance $H_2$ | 2 | 700 |
| | C | $TiCl_4$: 1.5%, $Al(CH_3)_3$: 0%, $AlCl_3$: 2.5%, $NH_3$: 1.0%, $N_2$: 12%, $C_2H_4$: 0%, balance $H_2$ | 5 | 900 |
| | D | $TiCl_4$: 1.5%, $Al(CH_3)_3$: 0%, $AlCl_3$: 2.5%, $NH_3$: 2.5%, $N_2$: 11%, $C_2H_4$: 0%, balance $H_2$ | 3.5 | 750 |
| | E | $TiCl_4$: 1.0%, $Al(CH_3)_3$: 1.0%, $AlCl_3$: 2.5%, $NH_3$: 2.0%, $N_2$: 15%, $C_2H_4$: 0%, balance $H_2$ | 2 | 800 |
| | F | $TiCl_4$: 1.0%, $Al(CH_3)_3$: 1.5%, $AlCl_3$: 1.5%, $NH_3$: 3.0%, $N_2$: 14%, $C_2H_4$: 0%, balance $H_2$ | 3.5 | 800 |
| | G | $TiCl_4$: 1.5%, $Al(CH_3)_3$: 2.0%, $AlCl_3$: 2.5%, $NH_3$: 1.0%, $N_2$: 15%, $C_2H_4$: 0%, balance $H_2$ | 2 | 700 |
| | H | $TiCl_4$: 0.5%, $Al(CH_3)_3$: 1.0%, $AlCl_3$: 2.0%, $NH_3$: 3.0%, $N_2$: 12%, $C_2H_4$: 0%, balance $H_2$ | 5 | 900 |
| | I | $TiCl_4$: 1.0%, $Al(CH_3)_3$: 2.0%, $AlCl_3$: 1.5%, $NH_3$: 2.0%, $N_2$: 11%, $C_2H_4$: 0%, balance $H_2$ | 3.5 | 750 |
| | J | $TiCl_4$: 1.0%, $Al(CH_3)_3$: 0%, $AlCl_3$: 1.5%, $NH_3$: 3.0%, $N_2$: 12%, $C_2H_4$: 0.5%, balance $H_2$ | 2 | 800 |
| Etching process | a | $TiCl_4$: 2.0%, balance $H_2$ | 3.5 | 800 |
| | b | $TiCl_4$: 3.0%, balance $H_2$ | 2 | 700 |
| | c | $TiCl_4$: 2.0%, balance $H_2$ | 5 | 900 |
| | d | $TiCl_4$: 4.0%, balance $H_2$ | 3.5 | 750 |
| | e | $TiCl_4$: 3.0%, balance $H_2$ | 2 | 800 |
| | f | $TiCl_4$: 3.0%, balance $H_2$ | 3.5 | 800 |
| | g | $TiCl_4$: 2.0%, balance $H_2$ | 2 | 700 |
| | h | $TiCl_4$: 4.0%, balance $H_2$ | 5 | 900 |
| | i | $TiCl_4$: 3.0%, balance $H_2$ | 3.5 | 750 |
| | j | $TiCl_4$: 2.0%, balance $H_2$ | 2 | 800 |

TABLE 5

| Type | | Cutting tool body symbol | Hard coating layer (the number at the bottom indicates the intended layer thickness (μm) of the hard coating layer) | | |
|---|---|---|---|---|---|
| | | | Lower layer | | |
| | | | 1st layer | 2nd layer | 3rd layer |
| Coated cutting tool of the present invention, comparative coated cutting tool, and reference coated cutting tool | 1 | A | — | — | — |
| | 2 | B | — | — | — |
| | 3 | C | — | — | — |
| | 4 | D | — | — | — |
| | 5 | A | — | — | — |
| | 6 | B | TiC (0.5) | — | — |
| | 7 | C | TiN-1 (0.3) | — | — |
| | 8 | D | TiN-1 (0.5) | l-TiCN-1 (4) | — |
| | 9 | A | TiN-1 (0.3) | l-TiCN-1 (2) | TiCN (0.7) |
| | 10 | B | — | — | — |
| | 11 | C | TiN-1 (0.5) | — | — |
| | 12 | D | TiC (1) | — | — |
| | 13 | A | TiN-1 (0.1) | — | — |
| | 14 | B | — | — | — |
| | 15 | C | — | — | — |

TABLE 6

| | | | | | | | Hard coating layer TiAl complex carbonitride layer $(Ti_{1-x}Al_x)(C_yN_{1-y})$ | | | | |
|---|---|---|---|---|---|---|---|---|---|---|---|
| Type | | Cutting tool body symbol | TiAlCN coating process formation symbol (refer Table 4) | Etching process formation symbol (refer Table 4) | Etching time per single etching (sec) | Number of etching times | Al content ratio x | C content ratio y | Difference between the local maximum and local minimum values of x | Ave. value of the period of the content ratio change of Ti and Al along with the crystal direction <001> (μm) |
| Coated cutting tool of the present invention | 1 | A | A | a | 30 | 500 | 0.95 | 0.0043 | 0.16 | 5 |
| | 2 | B | B | b | 15 | 900 | 0.76 | 0.0047 | 0.11 | 11 |
| | 3 | C | C | c | 15 | 60 | 0.79 | less than 0.0001 | 0.09 | 9 |
| | 4 | D | D | d | 5 | 800 | 0.75 | less than 0.0001 | 0.11 | 30 |
| | 5 | A | E | e | 30 | 600 | 0.93 | 0.0015 | 0.18 | 8 |
| | 6 | B | F | f | 5 | 240 | 0.67 | 0.0028 | 0.09 | 21 |
| | 7 | C | G | g | 5 | 600 | 0.83 | 0.0040 | 0.05 | 10 |
| | 8 | D | H | h | 30 | 600 | 0.93 | 0.0023 | 0.25 | 12 |
| | 9 | A | I | i | 30 | 420 | 0.68 | 0.0046 | 0.14 | 5 |
| | 10 | B | J | j | 15 | 750 | 0.60 | 0.0032 | 0.07 | 3 |
| | 11 | C | A | f | 15 | 400 | 0.95 | 0.0041 | 0.15 | 23 |
| | 12 | D | B | g | 5 | 600 | 0.76 | 0.0050 | 0.05 | 7 |
| | 13 | A | C | h | 15 | 150 | 0.79 | less than 0.0001 | 0.15 | 16 |
| | 14 | B | D | i | 5 | 600 | 0.75 | less than 0.0001 | 0.09 | 13 |
| | 15 | C | E | j | 30 | 300 | 0.93 | 0.0020 | 0.15 | 4 |

TABLE 6-continued

| | | | Hard coating layer | | | | | |
|---|---|---|---|---|---|---|---|---|
| | | | TiAl complex carbonitride layer $(Ti_{1-x}Al_x)(C_yN_{1-y})$ | | | | | |
| Type | | | Change of content ratio x in the plane perpendicular to the periodic content ratio change of Ti and Al along with the crystal direction <001> | Ave. grain width W (μm) | Ave. aspect ratio A | Area ratio of the cubic crystal phase (%) | Intended layer thickness (μm) | Upper layer (the number at the bottom indicates the intended average layer thickness (μm) of the layer) | |
| | | | | | | | | 1st layer | 2nd layer |
| Coated cutting tool of the present invention | 1 | less than 0.01 | 0.6 | 5.0 | 50 | 5 | — | — |
| | 2 | less than 0.01 | 0.3 | 0.7 | 54 | 6 | — | — |
| | 3 | less than 0.01 | 0.1 | 2.5 | 30 | 1 | — | — |
| | 4 | less than 0.01 | 0.2 | 0.8 | 49 | 8 | — | — |
| | 5 | less than 0.01 | 1.0 | 1.5 | 48 | 3 | — | — |
| | 6 | less than 0.01 | 0.3 | 0.9 | 80 | 4 | — | — |
| | 7 | less than 0.01 | 0.9 | 2.0 | 38 | 6 | — | — |
| | 8 | less than 0.01 | 0.7 | 1.4 | 65 | 2 | — | — |
| | 9 | less than 0.01 | 0.3 | 1.0 | 60 | 7 | — | — |
| | 10 | less than 0.01 | 0.05 | 0.3 | 69 | 5 | $Al_2O_3$ (5) | — |
| | 11 | less than 0.01 | 1.0 | 1.8 | 50 | 4 | TiCN (0.5) | $Al_2O_3$ (3) |
| | 12 | less than 0.01 | 0.5 | 1.0 | 54 | 3 | TiCO (1) | $Al_2O_3$ (2) |
| | 13 | less than 0.01 | 0.7 | 1.3 | 33 | 1 | TiCNO (0.3) | $Al_2O_3$ (1) |
| | 14 | less than 0.01 | 0.4 | 1.0 | 49 | 10 | — | — |
| | 15 | less than 0.01 | 0.8 | 3.2 | 48 | 3 | — | — |

TABLE 7

| | | | | | Hard coating layer | | | | | |
|---|---|---|---|---|---|---|---|---|---|---|
| | | | | | TiAl complex carbonitride layer $(Ti_{1-x}Al_x)(C_yN_{1-y})$ | | | | | |
| Type | | Cutting tool body symbol | TiAlCN coating process formation symbol (refer Table 4) | Etching process formation symbol (refer Table 4) | Etching time per single etching (sec) | Number of etching times | Al content ratio x | C content ratio y | Difference between the local maximum and local minimum values of x | Ave. value of the period of the content ratio change of Ti and Al along with the crystal direction <001> (μm) |
| Comparative coated cutting tool | 1 | A | A | — | — | — | 0.92 | 0.0042 | — | — |
| | 2 | B | B | — | — | — | 0.78 | 0.0047 | — | — |
| | 3 | C | C | — | — | — | 0.82 | less than 0.0001 | — | — |
| | 4 | D | D | — | — | — | 0.73 | less than 0.0001 | — | — |
| | 5 | A | E | — | — | — | 0.92 | 0.0017 | — | — |
| | 6 | B | F | — | — | — | 0.69 | 0.0031 | — | — |
| | 7 | C | G | — | — | — | 0.81 | 0.0036 | — | — |
| | 8 | D | H | — | — | — | 0.89 | 0.0028 | — | — |
| | 9 | A | I | — | — | — | 0.65 | 0.0050 | — | — |
| | 10 | B | J | — | — | — | 0.60 | 0.0034 | — | — |
| | 11 | C | A | — | — | — | 0.93 | 0.0046 | — | — |
| | 12 | D | B | — | — | — | 0.79 | 0.0048 | — | — |
| | 13 | A | C | — | — | — | 0.81 | less than 0.0001 | — | — |

TABLE 7-continued

| | | | | | | | | | | |
|---|---|---|---|---|---|---|---|---|---|---|
| Reference coated cutting tool | 14 | B | AIP | — | — | — | 0.77 | less than 0.0001 | — | — |
| | 15 | C | AIP | — | — | — | 0.90 | less than 0.0001 | — | — |

| | | Hard coating layer |||||||
|---|---|---|---|---|---|---|---|---|
| | | TiAl complex carbonitride layer $(Ti_{1-x}Al_x)(C_yN_{1-y})$ |||||||
| | | Change of content ratio x in the plane perpendicular to the periodic content ratio change of Ti and Al along with the crystal direction <001> | Ave. grain width W (μm) | Ave. aspect ratio A | Area ratio of the cubic crystal phase (%) | Intended layer thickness (μm) | Upper layer (the number at the bottom indicates the intended average layer thickness (μm) of the layer) ||
| Type | | | | | | | 1st layer | 2nd layer |
| Comparative coated cutting tool | 1 | — | 0.7 | 5.0 | 51 | 5 | — | — |
| | 2 | — | 0.4 | 0.8 | 51 | 6 | — | — |
| | 3 | — | 0.2 | 3.1 | 35 | 1 | — | — |
| | 4 | — | 0.2 | 1.2 | 53 | 8 | — | — |
| | 5 | — | 1.0 | 1.8 | 47 | 3 | — | — |
| | 6 | — | 0.4 | 1.5 | 80 | 4 | — | — |
| | 7 | — | 0.9 | 2.5 | 38 | 6 | — | — |
| | 8 | — | 0.8 | 1.5 | 67 | 2 | — | — |
| | 9 | — | 0.4 | 2.1 | 62 | 7 | — | — |
| | 10 | — | 0.08 | 0.5 | 72 | 5 | $Al_2O_3$ (5) | — |
| | 11 | — | 1.0 | 1.6 | 49 | 4 | TiCN (0.5) | $Al_2O_3$ (3) |
| | 12 | — | 0.5 | 1.5 | 59 | 3 | TiCO (1) | $Al_2O_3$ (2) |
| | 13 | — | 0.7 | 1.2 | 38 | 1 | TiCNO (0.3) | $Al_2O_3$ (1) |
| Reference coated cutting tool | 14 | — | 1.5 | 3.3 | — | 10 | — | — |
| | 15 | — | 0.6 | 2.2 | — | 3 | — | — |

Note:
"AIP" indicates coating by arc-ion plating.

Next, each of the coated cutting tools described above was clamped on the face milling cutter made of tool steel with the cutter diameter of 125 mm by a fixing jig. Then, the cutting test of high-speed-dry-center-cutting-face-milling was performed on the coated cutting tools of the present invention 1-15; the comparative coated cutting tools 1-13; and the reference coated cutting tools 14 and 15, in the clamped-state. The cutting test of high-speed-dry-center-cutting-face-milling is a type of high speed intermittent cutting of alloy steel, and was performed under the condition shown below. After the test, width of flank wear of the cutting edge was measured.

The results of the cutting test are shown in Table 8.

Cutting tool body: Tungsten carbide-based cemented carbide, titanium carbonitride-based cermet Cutting test: High speed dry face milling, center cut cutting Work: Block material of JIS-SCM440 standard having width of 100 mm and length of 400 mm Rotation speed: 917 min$^{-1}$ Cutting speed: 360 m/min Cutting depth: 1.0 mm Feed rate per tooth: 0.14 mm/tooth Cutting time: 8 minutes

TABLE 8

| Type | | Width of flank wear (mm) | Type | | Cutting test result (min) |
|---|---|---|---|---|---|
| Coated cutting tool of the present invention | 1 | 0.09 | Comparative coated cutting tool | 1 | 3.3* |
| | 2 | 0.11 | | 2 | 2.3* |
| | 3 | 0.10 | | 3 | 3.3* |
| | 4 | 0.11 | | 4 | 2.1* |
| | 5 | 0.09 | | 5 | 3.8* |
| | 6 | 0.13 | | 6 | 3.6* |
| | 7 | 0.08 | | 7 | 3.9* |
| | 8 | 0.08 | | 8 | 2.3* |
| | 9 | 0.13 | | 9 | 4.2* |
| | 10 | 0.14 | | 10 | 4.3* |
| | 11 | 0.07 | | 11 | 4.8* |
| | 12 | 0.09 | | 12 | 4.4* |
| | 13 | 0.08 | | 13 | 4.7* |
| | 14 | 0.12 | Reference coated cutting tool | 14 | 1.5* |
| | 15 | 0.11 | | 15 | 1.9* |

Asterisk marks in the column of the comparative and reference coated cutting tool indicate the cutting time (min) until reaching to its service life due to occurrence of chipping.

Example 2

As raw material powders, the WC powder, the TiC powder, the ZrC powder, the TaC powder, the NbC powder, the $Cr_3C_2$ powder, the TiN powder, and the CO powder, all of which had the average grain sizes of 1-3 µm, were prepared. These raw material powders were blended in the blending composition shown in Table 9. Then, wax was added to the blended mixture, and further mixed in acetone for 24 hours with a ball mill. After drying under reduced pressure, the mixtures were press-molded into green compacts with a predetermined shape under pressure of 98 MPa. Then, the obtained green compacts were sintered in vacuum in the condition of 5 Pa vacuum at the predetermined temperature in the range of 1370-1470° C. for 1 hour retention. After sintering, the cutting tool bodies α-γ, which had the insert-shape defined by ISO standard CNMG120412 and made of WC-based cemented carbide, were produced by performing honing (R: 0.07 mm) on the cutting edge part.

Also, as raw material powders, the TiCN powder (TiC/TiN=50/50 in mass ratio), the NbC powder, the WC powder, the Co powder, and the Ni powder, all of which had the average grain sizes of 0.5-2 µm, were prepared. These raw material powders were blended in the blending composition shown in Table 10. Then, the mixtures were wet-mixed for 24 hours with a ball mill. After drying, the mixtures were press-molded into green compacts under pressure of 98 MPa. The, the obtained green compacts were sintered in nitrogen atmosphere of 1.3 kPa at 1500° C. for 1 hour retention. After sintering, the cutting tool body γ, which had the insert-shape defined by ISO standard CNMG120412 and made of TiCN-based cermet, was produced by performing honing (R: 0.09 mm) on the cutting edge part.

Next, the coated cutting tools of the present invention 16-30 were produced by following the processes (a)-(c) described below.

Process (a)

By performing thermal CVD method for the predetermined lapse time in the formation conditions A-J, the granular structured $(Ti_{1-x}Al_x)(C_yN_{1-y})$ layers having the average grain width W and the aspect ratio A shown in Table 12 were formed (Layer forming process). In the formation conditions A-J: the reaction gas composition (volume %) included: 1.5-2.5% of $TiCl_4$; 3.0-5.0% of $Al(CH_3)_3$; 3.0-5.0% of $AlCl_3$; 2.0-5.0% of $NH_3$; 6.0-7.0% of $N_2$; 0-1.0% of $C_2H_4$; 6.0-7.0% of Ar; and the balance $H_2$. The pressure of the reaction atmosphere was set in the range of 2.0-5.0 kPa. The temperature of the reaction atmosphere was set in the range of 750-900° C.

Process (b)

The $TiCl_4$ etching process of the predetermined lapse time was inserted predetermined times in the above-described coating process (a) in the forming conditions a-j shown in Table 4 (Etching process). In the forming conditions a-j: the reaction gas composition (volume %) included: 2.0-5.0% of $TiCl_4$, and the balance $H_2$. The pressure of the reaction atmosphere was set in the range of 2.0-5.0 kPa. The temperature of the reaction atmosphere was set in the range of 750-900° C.

Process (c)

The coated cutting tools of the present invention 16-30 were produced by forming the hard coating layers made of the granular structured $(Ti_{1-x}Al_x)(C_yN_{1-y})$ layer, which had the intended layer thicknesses shown in Table 12 and the cubic phase and hexagonal phase crystal grains existed in, by inserting the etching process (b) for the predetermined lapse time and the predetermined repeating time shown in Table 12 during the coating process (a).

For the coated cutting tools of the present invention 19-28, the lower layer shown in Table 11 and/or the upper layer shown in Table 12 were formed in the coating process conditions indicted in Table 3.

For comparison purposes, the coated cutting tools of Comparative Examples 16-28 indicated in Table 13 were produced by vapor depositing the hard coating layer on the surface of the cutting tool bodies α-γ and the cutting tool body δ in intended thicknesses shown in Table 13 using a standard chemical vapor deposition apparatus in the conditions indicated in Tables 3 and 4 in the same manner.

Similarly to the coated cutting tools of the present invention 19-28, in regard to the coated cutting tools of comparative coated cutting tools 19-28, the lower layer shown in Table 11 and/or the upper layer shown in Table 13 were formed in the coating conditions shown in Table 3.

For reference, the coated cutting tools of Reference Example 29 and 30 indicated in Table 13 were produced by vapor depositing $(Ti_{1-x}Al_x)(C_yN_{1-y})$ layer of Reference Example on the surface of the cutting tool bodies β and γ in intended thicknesses using a conventional physical vapor deposition apparatus by arc-ion plating.

The condition for the arc-ion plating was the same as described in Example 1.

In regard to the coated cutting tools of the present invention 16-30; the comparative coated cutting tools 16-28; and the reference coated cutting tools 29 and 30, the cross sections of each constituting layers were subjected to measurement by the scanning electron microscopy (magnifying power: ×20000); and the average layer thicknesses were obtained by averaging the layer thicknesses measured at 5 points within the observation viewing field. In any measurement, the obtained layer thickness was practically the same as the intended total layer thicknesses shown in Tables 12 and 13.

In addition, in regard to the hard coating layers of the coated cutting tools of the present invention 16-30; the comparative coated cutting tools 16-28; and the reference coated cutting tools 29 and 30, the average Al content ratio x; the average C content ratio y; the average grain width W and the average aspect ratio A of the crystal grains constituting the granular structured $(Ti_{1-x}Al_x)(C_yN_{1-y})$ layer; and the area ratio occupied by the cubic crystal phase in the crystal grains were obtained by using the same methods indicated in Example 1.

Results were indicated in Tables 12 and 13.

In regard to the Ti and Al complex nitride or carbonitride layer constituting the hard coating layers of the coated cutting tools of the present invention 16-30, multiple fields of view were observed by using a scanning electron microscope (magnifying power: ×5000 to ×20000). In the observation, the presence of the granular-structured $(Ti_{1-x}Al_x)(C_yN_{1-y})$ layer in which the cubic phase and hexagonal phase crystal grains existed, was confirmed as indicated in the schematic diagram of the layer constitution shown in FIG. 1. In addition, existence of the periodic concentration change of Ti and Al in the cubic crystal grain was confirmed by the plane analysis by the energy dispersive X-ray spectroscopy method (EDS) by using a transmission electron microscope (magnifying power: ×20000). In addition, by further analyzing, it was confirmed that the difference obtained by subtracting the local minimum value from the local maximum value of x was in the range of 0.05-0.25.

In addition, in regard to the complex nitride or carbonitride layer, when the crystal structure of the individual crystal grains was analyzed in the vertical cross section direction of the Ti and Al complex nitride or carbonitride layer using the electron backscatter diffraction apparatus, it was confirmed that the layer was a mixed structure of: the cubic crystal phase, in which the electron backscatter diffraction pattern of the cubic crystal lattice was observed; and the hexagonal crystal phase, in which the electron backscatter diffraction pattern of the hexagonal crystal lattice was observed. In addition, it was confirmed that the area ratio occupied by the cubic phase crystal grains relative to the total of the cubic and hexagonal crystal phases whose electron backscatter diffraction patterns were observed, was 30-80 area %.

TABLE 9

| Type | | Co | TiC | ZrC | TaC | NbC | Cr₃C₂ | TiN | WC |
|---|---|---|---|---|---|---|---|---|---|
| Cutting tool body | α | 6.5 | — | 1.5 | — | 2.9 | 0.1 | 1.5 | balance |
| | β | 7.6 | 2.6 | — | 4.0 | 0.5 | — | 1.1 | balance |
| | γ | 6.0 | — | — | — | — | — | — | balance |

TABLE 10

| Type | | Co | Ni | NbC | WC | TiCN |
|---|---|---|---|---|---|---|
| Cutting tool body | δ | 11 | 4 | 6 | 15 | balance |

TABLE 11

| | | Cutting tool body | Hard coating layer (the number at the bottom indicates the average intended layer thickness (μm) of the hard coating layer) Lower layer | | | |
|---|---|---|---|---|---|---|
| Type | | symbol | 1st layer | 2nd layer | 3rd layer | 4th layer |
| Coated cutting tool of the present invention, comparative coated cutting tool, and reference coated cutting tool | 16 | α | — | — | — | — |
| | 17 | β | — | — | — | — |
| | 18 | γ | — | — | — | — |
| | 19 | δ | TiC (0.5) | — | — | — |
| | 20 | α | TiN-1 (0.1) | — | — | — |
| | 21 | β | TiN-1 (0.5) | 1-TiCN-1 (7) | — | — |
| | 22 | γ | TiN-1 (0.3) | 1-TiCN-1 (10) | TiN-2 (0.7) | — |
| | 23 | δ | TiN-1 (0.3) | 1-TiCN-1 (4) | TiCN (0.4) | TiN-2 (0.3) |
| | 24 | α | — | — | — | — |
| | 25 | β | TiN-1 (0.5) | — | — | — |
| | 26 | γ | TiC (1) | — | — | — |
| | 27 | δ | TiN-1 (0.1) | — | — | — |
| | 28 | α | TiN-1 (0.1) | — | — | — |
| | 29 | β | — | — | — | — |
| | 30 | γ | — | — | — | — |

TABLE 12

| | | | | | | Hard coating layer TiAl complex carbonitride layer $(Ti_{1-x}Al_x)(C_yN_{1-y})$ | | | | |
|---|---|---|---|---|---|---|---|---|---|---|
| Type | | Cutting tool symbol | TiAlCN coating process formation symbol (refer Table 4) | Etching process formation symbol | Etching time per single etching (sec) | Number of etching times | Al content ratio x | C content ratio y | Difference between the local maximum and local minimum values of x | Ave. value of the period of the content ratio change of Ti and Al along with the crystal direction <001> |
| Comparative coated cutting tool | 16 | α | A | a | 30 | 800 | 0.94 | 0.0046 | 0.18 | 5 |
| | 17 | β | B | b | 15 | 2100 | 0.78 | 0.0050 | 0.13 | 10 |
| | 18 | γ | C | c | 15 | 1200 | 0.76 | less than 0.0001 | 0.07 | 7 |
| | 19 | δ | D | d | 5 | 300 | 0.71 | less than 0.0001 | 0.12 | 27 |
| | 20 | α | E | e | 30 | 2400 | 0.89 | 0.0011 | 0.19 | 9 |
| | 21 | β | F | f | 5 | 420 | 0.71 | 0.0022 | 0.09 | 23 |
| | 22 | γ | G | g | 5 | 1300 | 0.87 | 0.0034 | 0.06 | 12 |

TABLE 12-continued

|  | # | | | | | | | | | |
|---|---|---|---|---|---|---|---|---|---|---|
|  | 23 | δ | H | h | 30 | 900 | 0.92 | 0.0016 | 0.25 | 11 |
|  | 24 | α | I | i | 30 | 420 | 0.65 | 0.0037 | 0.17 | 6 |
|  | 25 | β | J | j | 15 | 1200 | 0.62 | 0.0039 | 0.09 | 4 |
|  | 26 | γ | A | f | 15 | 600 | 0.95 | 0.0035 | 0.14 | 21 |
|  | 27 | δ | B | g | 5 | 200 | 0.78 | 0.0049 | 0.06 | 8 |
|  | 28 | α | C | h | 15 | 1350 | 0.73 | less than 0.0001 | 0.14 | 16 |
| Reference coated cutting tool | 29 | β | D | i | 5 | 360 | 0.71 | less than 0.0001 | 0.07 | 12 |
|  | 30 | γ | E | j | 30 | 800 | 0.91 | 0.0022 | 0.16 | 3 |

| | | Hard coating layer | | | | | | | | |
|---|---|---|---|---|---|---|---|---|---|---|
| | | TiAl complex carbonitride layer $(Ti_{1-x}Al_x)(C_yN_{1-y})$ | | | | | Upper layer (the number at the bottom indicates the intended average layer thickness (μm) of the layer) | | | |
| Type | # | Change of content ratio x in the plane perpendicular to the periodic content ratio change of Ti and Al along with the crystal direction <001> | Ave. grain width W (μm) | Ave. aspect ratio A | Area ratio of the cubic crystal phase (%) | Intended layer thickness (μm) | 1st layer | 2nd layer | 3rd layer | 4th layer |
| Comparative coated cutting tool | 16 | less than 0.01 | 0.5 | 4.8 | 56 | 8 | — | — | — | — |
|  | 17 | less than 0.01 | 0.4 | 0.7 | 58 | 14 | — | — | — | — |
|  | 18 | less than 0.01 | 0.2 | 2.4 | 30 | 20 | — | — | — | — |
|  | 19 | less than 0.01 | 0.2 | 0.7 | 47 | 3 | — | — | — | — |
|  | 20 | less than 0.01 | 1.0 | 1.3 | 46 | 12 | — | — | — | — |
|  | 21 | less than 0.01 | 0.4 | 0.8 | 79 | 7 | — | — | — | — |
|  | 22 | less than 0.01 | 0.8 | 1.6 | 41 | 13 | TiN-2 (0.7) | — | — | — |
|  | 23 | less than 0.01 | 0.6 | 1.3 | 71 | 3 | TiCN (0.4) | TiN-2 (0.3) | — | — |
|  | 24 | less than 0.01 | 0.4 | 1.1 | 58 | 7 | $Al_2O_3$ (4) | — | — | — |
|  | 25 | less than 0.01 | 0.08 | 0.4 | 72 | 8 | TiCN (0.5) | $Al_2O_3$ (5) | — | — |
|  | 26 | less than 0.01 | 0.9 | 1.6 | 53 | 6 | TiCO (1) | $Al_2O_3$ (2) | — | — |
|  | 27 | less than 0.01 | 0.5 | 1.2 | 58 | 1 | TiCNO (0.3) | $Al_2O_3$ (1) | — | — |
|  | 28 | less than 0.01 | 0.6 | 1.1 | 31 | 9 | TiN-2 (0.3) | TiCN (0.8) | TiCNO (0.3) | $Al_2O_3$ (5) |
| Reference coated cutting tool | 29 | less than 0.01 | 0.3 | 1.3 | 47 | 6 | — | — | — | — |
|  | 30 | less than 0.01 | 0.9 | 2.9 | 53 | 8 | — | — | — | — |

TABLE 13

| | | | | Hard coating layer TiAl complex carbonitride layer $(Ti_{1-x}Al_x)(C_yN_{1-y})$ | | | | | |
|---|---|---|---|---|---|---|---|---|---|
| Type | | Cutting tool symbol | TiAlCN coating process formation symbol (refer Table 4) | Etching process formation symbol | Etching time per single etching (sec) | Number of etching times | Al content ratio x | C content ratio y | Difference between the local maximum and local minimum values of x | Ave. value of the period of the content ratio change of Ti and Al along with the crystal direction <001> (μm) |
| Comparative coated cutting tool | 16 | α | A | — | — | — | 0.95 | 0.0044 | — | — |
| | 17 | β | B | — | — | — | 0.79 | 0.0049 | — | — |
| | 18 | γ | C | — | — | — | 0.78 | less than 0.0001 | — | — |
| | 19 | δ | D | — | — | — | 0.72 | less than 0.0001 | — | — |
| | 20 | α | E | — | — | — | 0.86 | 0.0014 | — | — |
| | 21 | β | F | — | — | — | 0.73 | 0.0023 | — | — |
| | 22 | γ | G | — | — | — | 0.86 | 0.0037 | — | — |
| | 23 | δ | H | — | — | — | 0.95 | 0.0018 | — | — |
| | 24 | α | I | — | — | — | 0.67 | 0.0036 | — | — |
| | 25 | β | J | — | — | — | 0.63 | 0.0037 | — | — |
| | 26 | γ | A | — | — | — | 0.95 | 0.0031 | — | — |
| | 27 | δ | B | — | — | — | 0.79 | 0.0046 | — | — |
| | 28 | α | C | — | — | — | 0.75 | less than 0.0001 | — | — |
| Reference coated cutting tool | 29 | β | AIP | — | — | — | 0.76 | less than 0.0001 | — | — |
| | 30 | γ | AIP | — | — | — | 0.91 | less than 0.0001 | — | — |

| | | Hard coating layer TiAl complex carbonitride layer $(Ti_{1-x}Al_x)(C_yN_{1-y})$ | | | | | Upper layer (the number at the bottom indicates the intended average layer thickness (μm) of the layer) | | | |
|---|---|---|---|---|---|---|---|---|---|---|
| Type | | Change of content ratio x in the plane perpendicular to the periodic content ratio change of Ti and Al along with the crystal direction <001> | Ave. grain width W (μm) | Ave. aspect ratio A | Area ratio of the cubic crystal phase (%) | Intended layer thickness (μm) | 1st layer | 2nd layer | 3rd layer | 4th layer |
| Comparative coated cutting tool | 16 | — | 0.9 | 5.0 | 58 | 8 | — | — | — | — |
| | 17 | — | 0.5 | 0.9 | 60 | 14 | — | — | — | — |
| | 18 | — | 0.3 | 2.8 | 33 | 20 | — | — | — | — |
| | 19 | — | 0.4 | 1.3 | 51 | 3 | — | — | — | — |
| | 20 | — | 1.0 | 1.5 | 48 | 12 | — | — | — | — |
| | 21 | — | 0.5 | 0.9 | 81 | 7 | — | — | — | — |
| | 22 | — | 0.9 | 2.0 | 43 | 13 | TiN-2 (0.7) | — | — | — |
| | 23 | — | 0.7 | 1.5 | 73 | 3 | TiCN (0.4) | TiN-2 (0.3) | — | — |
| | 24 | — | 0.5 | 1.3 | 62 | 7 | Al₂O₃ (4) | — | — | — |
| | 25 | — | 0.1 | 0.5 | 72 | 8 | TiCN (0.5) | Al₂O₃ (5) | — | — |

TABLE 13-continued

| | | | | | | | | | | |
|---|---|---|---|---|---|---|---|---|---|---|
| | 26 | — | 1.0 | 2.1 | 51 | 6 | TiCO (1) | Al$_2$O$_3$ (2) | — | — |
| | 27 | — | 0.6 | 1.1 | 63 | 1 | TiCNO (0.3) | Al$_2$O$_3$ (1) | — | — |
| | 28 | — | 0.9 | 1.3 | 35 | 9 | TiN-2 (0.3) | TiCN (0.8) | TiCNO (0.3) | Al$_2$O$_3$ (5) |
| Reference coated cutting tool | 29 | — | 1.2 | 2.0 | — | 6 | — | — | — | — |
| | 30 | — | 1.3 | 3.5 | — | 8 | — | — | — | — |

Note:
"AIP" indicates film formation by arc-ion plating.

Next, each of the coated cutting tools described above was clamped on the front end part of the bit made of tool steel by a fixing jig. Then, the dry high-speed intermittent cutting test on carbolized steel and the wet high-speed intermittent cutting test on a cast iron were performed on the coated cutting tools of the present invention 16-30; the comparative coated cutting tools 16-28; and the reference coated cutting tools 29 and 30, in the clamped-state. After the test, width of flank wear of the cutting edge was measured.

Cutting Condition 1:
Work: Round bar in JIS-SCM435 standard with 4 evenly spaced slits in the longitudinal direction
  Cutting speed: 360 m/min
  Cutting depth: 1.2 mm
  Feed rate: 0.2 mm/rev.
  Cutting time: 5 minutes
  (the normal cutting speed is 220 m/min)

Cutting Condition 2:
Work: Round bar in JIS-FCD450 standard with 4 evenly spaced slits in the longitudinal direction
  Cutting speed: 340 m/min
  Cutting depth: 1.0 mm
  Feed rate: 0.2 mm/rev.
  Cutting time: 5 minutes
  (the normal cutting speed is 200 m/min)

The results of the cutting tests are shown in Table 14.

TABLE 14

| Type | | Width of flank wear (mm) | | Type | | Cutting test result (min) | |
|---|---|---|---|---|---|---|---|
| | | | | | | Cutting condition 1 | Cutting condition 2 |
| Coated cutting tool of the present invention | 16 | 0.20 | 0.23 | Comparative coated cutting tool | 16 | 3.8* | 2.7* |
| | 17 | 0.21 | 0.23 | | 17 | 3.9* | 2.6* |
| | 18 | 0.21 | 0.22 | | 18 | 3.3* | 3.9* |
| | 19 | 0.21 | 0.24 | | 19 | 2.3* | 2.1* |
| | 20 | 0.20 | 0.23 | | 20 | 4.2* | 3.6* |
| | 21 | 0.23 | 0.25 | | 21 | 4.2* | 3.5* |
| | 22 | 0.19 | 0.11 | | 22 | 3.8* | 4.6* |
| | 23 | 0.12 | 0.13 | | 23 | 3.3* | 2.7* |
| | 24 | 0.22 | 0.25 | | 24 | 4.7* | 4.4* |
| | 25 | 0.23 | 0.26 | | 25 | 4.8* | 4.3* |
| | 26 | 0.09 | 0.10 | | 26 | 4.3* | 4.6* |
| | 27 | 0.19 | 0.22 | | 27 | 3.3* | 3.3* |
| | 28 | 0.10 | 0.20 | | 28 | 4.8* | 3.9* |
| | 29 | 0.22 | 0.24 | Reference coated cutting tool | 29 | 2.3* | 1.9* |
| | 30 | 0.22 | 0.22 | | 30 | 2.1* | 2.0* |

Asterisk marks in the column of the comparative and reference coated cutting tool indicate the cutting time (min) until reaching to its service life due to occurrence of chipping.

Example 3

The cutting tool bodies A2 and B2 were produced by the process explained below. First, as raw material powders, the cBN powder, the TiN powder, the TiCN powder, the TiC powder, the Al powder, and Al$_2$O$_3$ powder, all of which had the average grain sizes of 0.5-4 μm, were prepared. These raw material powders were blended in the blending composition shown in Table 15. Then, the mixtures were wet-mixed for 80 hours with a ball mill After drying, the mixtures were press-molded into green compacts with a dimension of: diameter of 50 mm; and thickness of 1.5 mm, under pressure of 120 MPa. Then, the obtained green compacts were sintered in vacuum in the condition of 1 Pa vacuum at the predetermined temperature in the range of 900-1300° C. for 60 minutes retention to obtain preliminary sintered bodies for the cutting edge pieces. The obtained preliminary sintered bodies were placed on separately prepared supporting pieces made of WC-based cemented carbide alloy, which had the composition of: 8 mass % of Co; and the WC balance, and the dimension of: diameter of 50 mm; and thickness of 2 mm They were inserted into a standard ultra-high pressure sintering apparatus in the stacked state. Then, they were subjected to ultra-high-pressure sintering in the standard condition of: 4 GPa of pressure; a predetermined temperature within the range of 1200-1400° C.; and 0.8 hour of the retention time. Then, the top and bottom surfaces of the sintered bodies were grinded by using a diamond grind tool. Then, they were divided into a predetermined dimension with a wire-electrical discharge machine. Then, they were brazed on the brazing portion (corner portion) of the insert main cutting tool body made of WC-based cemented carbide alloy, which had the composition of: 5 mass % of Co; 5 mass % of TaC; and the WC balance, and the shape defined by ISO CNGA120412 standard (the diamond shape of: thickness of 4.76 mm; and inscribed circle diameter of 12.7 mm) by using the brazing material made of Ti—Zr—Cu alloy having composition made of: 37.5% of Zr; 25% of Cu; and the Ti balance in volume %. Then, after performing outer peripheral machining into a predetermined dimension, the cutting edges of the brazed parts were subjected to a honing work of: width of 0.13 mm; and angle of 25°. Then, by performing the final polishing on them, the cutting tool bodies A2 and B2 with the insert shape defined by ISO CNGA120412 standard were produced.

TABLE 15

| Type | | Blending composition (mass %) | | | | |
|---|---|---|---|---|---|---|
| | | TiN | TiC | Al | Al$_2$O$_3$ | cBN |
| Cutting tool body | A2 | 50 | — | 5 | 3 | balance |
| | B2 | — | 50 | 4 | 3 | balance |

Next, the coated cutting tools of the present invention 31-40 indicated in Tables 17 were produced by vapor depositing the (Ti$_{1-x}$Al$_x$)(C$_y$N$_{1-y}$) layer related to the present invention on the surfaces of the cutting tool bodies A2 and B2 in the intended layer thicknesses using a standard chemical vapor deposition apparatus in the conditions indicated in Tables 3 and 4 as in the same method as Example 1.

In regard to the coated cutting tools of the present invention 34-38, the lower layer shown in Table 16 and/or the upper layer shown in Table 17 were formed in the forming condition shown in Table 3.

For comparison purposes, the comparative coated cutting tools 31-38 indicated in Table 18 were produced by vapor depositing the hard coating layer including at least the $(Ti_{1-x}Al_x)(C_yN_{1-y})$ layer on the surface of the tool bodies A2 and B2 in intended thicknesses using a standard chemical vapor deposition apparatus in the conditions indicated in Tables 3 and 4.

As in the coated cutting tools of the present invention 34-38, the lower layer as shown in Table 16 and/or the upper layer as shown in Table 18 were formed in the formation conditions shown in Table 3 in the comparative coated cutting tools 34-38.

For reference, the reference coated cutting tools 39 and 40 indicated in Table 18 were produced by vapor depositing the $(Ti_{1-x}Al_x)(C_yN_{1-y})$ layer on the surfaces of the cutting tool bodies A2 and B2 in the intended thickness using a conventional physical vapor deposition apparatus by arc-ion plating.

The condition for the arc-ion plating was the same as described in Example 1. By vapor depositing $(Ti_{1-x}Al_x)(C_yN_{1-y})$ layer on the surfaces of the above-mentioned cutting tool bodies in the intended compositions and layer thicknesses indicated in Table 18 in the arc-ion plating, the reference coated cutting tools 39 and 40 were produced.

Cross sections of each constituent layer of the coated cutting tools of the present invention 31-40; the comparative coated cutting tools 31-38; and the reference coated cutting tools 39 and 40, were subjected to measurement by using a scanning electron microscope (magnifying power: ×5000), and the layer thicknesses were obtained by averaging layer thicknesses measured at 5 points within the observation viewing field. In any measurement, the obtained layer thickness was practically the same as the intended total layer thicknesses shown in Tables 17 and 18.

In regard to the coated cutting tools of the present invention 31-40; the comparative coated cutting tools 31-38; and the reference coated cutting tools 39 and 40, the average Al content ratio x; the average C content ratio y; the average grain width W of the crystal grains constituting the $(Ti_{1-x}Al_x)(C_yN_{1-y})$ layer in the granular structure; the average aspect ratio A; and the area ratio occupied by the cubic crystal phase in the crystal grain, were obtained as in the method indicated in Example 1. The measurement results are shown in Tables 17 and 18.

TABLE 16

| | | Hard coating layer (the number at the bottom indicates the intended layer thickness (μm) of the hard coating layer) | | |
|---|---|---|---|---|
| | Cutting tool | | Lower layer | |
| Type | body symbol | 1st | 2nd | 3rd |
| Coated cutting | 31 | A2 | — | — | — |
| tool of the | 32 | B2 | — | — | — |
| present | 33 | A2 | — | — | — |
| invention, | 34 | B2 | TiC (0.5) | — | — |
| comparative | 35 | A2 | TiN-3 (0.5) | — | — |
| coated | 36 | B2 | TiN-3 (0.1) | — | — |
| cutting tool, and reference | 37 | A2 | TiN-3 (0.5) | l-TiCN-2 (3) | — |
| coated cutting tool | 38 | B2 | TiN-3 (0.3) | l-TiCN-2 (7) | TiN-3 (0.7) |
| | 39 | A2 | — | — | — |
| | 40 | B2 | — | — | — |

TABLE 17

| | | Hard coating layer TiAl complex carbonitride layer $(Ti_{1-x}Al_x)(C_yN_{1-y})$ | | | | | | | |
|---|---|---|---|---|---|---|---|---|---|
| Type | Cutting tool body symbol | TiAlCN coating process formation symbol (refer Table 4) | Etching process formation symbol (refer Table 4) | Etching time per single etching (sec) | Number of etching times | Al content ratio x | C content ratio y | Difference between the local maximum and local minimum values of x |
| Coated cutting tool of the present invention | 31 | A2 | B | b | 15 | 150 | 0.83 | 0.0048 | 0.14 |
| | 32 | B2 | D | d | 5 | 500 | 0.79 | less than 0.0001 | 0.10 |
| | 33 | A2 | G | g | 5 | 900 | 0.89 | 0.0039 | 0.07 |
| | 34 | B2 | I | i | 30 | 120 | 0.73 | 0.0047 | 0.15 |
| | 35 | A2 | D | i | 5 | 240 | 0.79 | less than 0.0001 | 0.08 |
| | 36 | B2 | B | g | 5 | 800 | 0.86 | 0.0048 | 0.05 |
| | 37 | A2 | I | d | 30 | 900 | 0.75 | 0.0044 | 0.16 |
| | 38 | B2 | G | b | 5 | 200 | 0.89 | 0.0041 | 0.19 |
| | 39 | A2 | B | g | 15 | 400 | 0.81 | 0.0046 | 0.21 |
| | 40 | B2 | D | i | 15 | 420 | 0.82 | less than 0.0001 | 0.16 |

TABLE 17-continued

| | | Hard coating layer | | | | | | |
|---|---|---|---|---|---|---|---|---|
| | | TiAl complex carbonitride layer $(Ti_{1-x}Al_x)(C_yN_{1-y})$ | | | | | | Upper layer |
| Type | | Ave. value of the period of the content ratio change of Ti and Al along with the crystal direction <001> | Change of content ratio x in the plane perpendicular to the periodic content ratio change of Ti and Al along with the crystal direction <001> | Ave. grain width W (μm) | Ave. aspect ratio A | Area ratio of the cubic crystal phase (%) | Intended layer thickness (μm) | (the number at the bottom indicates the intended layer thickness (μm) of the upper layer) |
| Coated cutting tool of the present invention | 31 | 12 | less than 0.01 | 0.5 | 0.8 | 49 | 1 | — |
| | 32 | 27 | less than 0.01 | 0.3 | 0.9 | 43 | 5 | — |
| | 33 | 9 | less than 0.01 | 0.9 | 1.8 | 36 | 9 | — |
| | 34 | 6 | less than 0.01 | 0.4 | 1.1 | 57 | 2 | — |
| | 35 | 11 | less than 0.01 | 0.3 | 1.2 | 46 | 4 | TiN-3 (0.5) |
| | 36 | 6 | less than 0.01 | 0.6 | 1.1 | 57 | 4 | — |
| | 37 | 8 | less than 0.01 | 0.3 | 0.9 | 59 | 6 | — |
| | 38 | 7 | less than 0.01 | 0.9 | 1.7 | 34 | 2 | — |
| | 39 | 8 | less than 0.01 | 0.4 | 0.8 | 51 | 2 | — |
| | 40 | 16 | less than 0.01 | 0.3 | 0.9 | 46 | 7 | — |

TABLE 18

| | | | Hard coating layer TiAl complex carbonitride layer $(Ti_{1-x}Al_x)(C_yN_{1-y})$ | | | | | | |
|---|---|---|---|---|---|---|---|---|---|
| Type | | Cutting tool body symbol | TiAlCN coating process formation symbol (refer Table 4) | Etching process formation symbol | Etching time per single etching (sec) | Number of etching times | Al content ratio x | C content ratio y | Difference between the local maximum and local minimum values of x |
| Comparative coated cutting tool | 31 | A2 | B | — | — | — | 0.85 | 0.0048 | — |
| | 32 | B2 | D | — | — | — | 0.80 | less than 0.0001 | — |
| | 33 | A2 | G | — | — | — | 0.88 | 0.0039 | — |
| | 34 | B2 | I | — | — | — | 0.75 | 0.0047 | — |
| | 35 | A2 | D | — | — | — | 0.79 | less than 0.0001 | — |
| | 36 | B2 | B | — | — | — | 0.87 | 0.0048 | — |
| | 37 | A2 | I | — | — | — | 0.78 | 0.0044 | — |
| | 38 | B2 | G | — | — | — | 0.90 | 0.0041 | — |
| Reference coated cutting tool | 39 | A2 | AIP | — | — | — | 0.78 | less than 0.0001 | — |
| | 40 | B2 | AIP | — | — | — | 0.90 | less than 0.0001 | — |

TABLE 18-continued

| | | Hard coating layer | | | | | |
|---|---|---|---|---|---|---|---|
| | | TiAl complex carbonitride layer $(Ti_{1-x}Al_x)(C_yN_{1-y})$ | | | | | Upper layer |
| Type | | Ave. value of the period of the content ratio change of Ti and Al along with the crystal direction <001> | Change of content ratio x in the plane perpendicular to the periodic content ratio change of Ti and Al along with the crystal direction <001> | Ave. grain width W (μm) | Ave. aspect ratio A | Area ratio of the cubic crystal phase (%) | Intended layer thickness (μm) | (the number at the bottom indicates the intended layer thickness (μm) of the upper layer) |
| Comparative coated cutting tool | 31 | — | — | 0.6 | 0.8 | 52 | 1 | — |
| | 32 | — | — | 0.4 | 1.0 | 45 | 5 | — |
| | 33 | — | — | 0.9 | 1.7 | 36 | 9 | — |
| | 34 | — | — | 0.4 | 1.1 | 56 | 2 | — |
| | 35 | — | — | 0.4 | 1.3 | 48 | 4 | TiN-3 (0.5) |
| | 36 | — | — | 0.7 | 1.2 | 60 | 4 | — |
| | 37 | — | — | 0.5 | 0.8 | 62 | 6 | — |
| | 38 | — | — | 0.9 | 1.6 | 36 | 2 | — |
| Reference coated cutting tool | 39 | — | — | 0.8 | 1.2 | — | 2 | — |
| | 40 | — | — | 1.2 | 3.0 | — | 7 | — |

Next, each coated cutting tool was screwed on the tip of the insert holder made of tool steel by a fixing jig. Then, the dry high speed intermittent cutting test of carbolized steel explained below were performed on the coated cutting tools of the present invention 31-40; the comparative coated cutting tools 31-38; and the reference coated cutting tools 39 and 40. After the tests, width of flank wear of the cutting edge was measured.

Cutting tool body: Cubic boron nitride-based ultra-high pressure sintered material Cutting test: Dry high-speed intermittent cutting work of a carbolized steel Work: Round bar in JIS-SCr420 standard (hardness: HRC60) with 4 evenly spaced slits in the longitudinal direction Cutting speed: 220 m/min
Cutting depth: 0.12 mm
Feed rate: 0.10 mm/rev.
Cutting time: 4 minutes Results of the cutting test are shown in Table 19.

TABLE 19

| Type | | Width of flank wear (mm) | Type | | Cutting test result (min) |
|---|---|---|---|---|---|
| Coated cutting tool of the present invention | 31 | 0.07 | Comparative coated cutting tool | 31 | 2.1* |
| | 32 | 0.10 | | 32 | 2.0* |
| | 33 | 0.08 | | 33 | 2.2* |
| | 34 | 0.12 | | 34 | 2.0* |
| | 35 | 0.08 | | 35 | 2.3* |
| | 36 | 0.08 | | 36 | 2.3* |
| | 37 | 0.09 | | 37 | 2.3* |
| | 38 | 0.07 | | 38 | 2.2* |
| | 39 | 0.09 | Reference coated cutting tool | 39 | 1.8* |
| | 40 | 0.09 | | 40 | 1.6* |

Asterisk marks in the column of the comparative and reference coated cutting tool indicate the cutting time (min) until reaching to its service life due to occurrence of chipping.

Based on the results shown in Tables 8, 14, and 19, it was demonstrated that hardness was improved due to the strain in the crystal grains and toughness was improved too while keeping a high abrasion resistance in the coated cutting tool of the present invention by having the content ratio change of Ti and Al in the cubic crystal grains constituting the Al and Ti complex nitride or complex carbonitride layer constituting the hard coating layer. In addition, the surface coated cutting tools of the present invention showed an excellent chipping resistance and an excellent fracturing resistance even if they were used in high speed intermittent cutting work. It is clear that they exhibited an excellent wear resistance for a long-term usage because of these.

Contrary to that, in regard to: the comparative coated cutting tools 1-13, 16-28, and 31-38; and the reference coated cutting tools 14, 15, 29, 30, 39, and 40, in which there were no content ratio change of Ti and Al in the cubic crystal grains constituting the Al and Ti complex nitride or complex carbonitride layer constituting the hard coating layer, they reached to their service lives in a relatively short period of time due to occurrence of chipping, fracturing, or the like when they were used in the high speed intermittent cutting work in which intermittent and impacting high load impinges on the cutting edge.

INDUSTRIAL APPLICABILITY

The coated cutting tool of the present invention can be utilized in high speed intermittent cutting of a wide variety of works as well as of alloy steel as described above. Furthermore, the coated cutting tool of the present invention exhibits an excellent chipping resistance and an excellent wear resistance for a long-term usage. Thus, the coated cutting tool of the present invention can be sufficiently adapted to high-performance cutting apparatuses; and labor-saving, energy-saving, and cost-saving of cutting work.

BRIEF DESCRIPTION OF THE REFERENCE SYMBOLS

1: Cutting tool body
2: Hard coating layer
3: Complex nitride layer or complex carbonitride layer
4: Region in which Al content amount is relatively high 5: Region in which Al content amount is relatively low
6: Region A
7: Region B

The invention claimed is:

1. A surface coated cutting tool comprising:
a cutting tool body made of any one of tungsten carbide-based cemented carbide, titanium carbonitride-based cermet, and cubic boron nitride-based ultra-high pressure sintered material; and a hard coating layer provided on a surface of the cutting tool body, wherein
the hard coating layer comprises at least a Ti and Al complex nitride or carbonitride layer, which is formed by a chemical vapor deposition method and has an average layer thickness of 1 to 20 μm,
in a case where a composition of the complex nitride or carbonitride layer is expressed by a composition formula: $(Ti_{1-x}Al_x)(C_yN_{1-y})$, a content ratio x, which is a ratio of Al to a total amount of Ti and Al; and a content ratio y, which is a ratio of C to a total amount of C and N, satisfy $0.60 \le x \le 0.95$ and $0 \le y \le 0.005$, respectively, provided that each of x and y is in atomic ratio,
crystal grains constituting the complex nitride or carbonitride layer includes cubic phase crystal grains; and hexagonal phase crystal grains,
an area ratio occupied by the cubic phase crystal grains is 30-80% in a plane perpendicular to the surface of the cutting tool body,
an average grain width W; and an average aspect ratio A of the crystal grains with the cubic grain structure are 0.05-1.0 μm; and 5 or less, respectively,
a periodic content ratio change of Ti and Al in the composition formula: $(Ti_{1-x}Al_x)(C_yN_{1-y})$ exists in each of the cubic phase crystal grains, and
a difference obtained by subtracting a local minimum value x from a local maximum value x in the periodic content ratio change is 0.05-0.25.

2. The surface coated cutting tool according to claim 1, wherein
in the cubic phase crystal grains having the periodic content ratio change of Ti and Al in the complex nitride or carbonitride layer:
the periodic content ratio change of Ti and Al is aligned along with a direction belonging to equivalent crystal directions expressed by <001> in a cubic crystal system;
a period along the direction is 3-30 nm; and
a change of content ratio x of Ti and Al in a plane perpendicular to the direction is 0.01 or less.

3. The surface coated cutting tool according to claim 1, wherein
in the cubic phase crystal grains having the periodic content ratio change of Ti and Al in the complex nitride or carbonitride layer:
a region A and a region B exist; and
a boundary of the region A and region B is formed in a crystal plane belonging to equivalent crystal planes expressed by {110}, wherein (a) the region A is a region, in which the periodic content ratio change of Ti and Al is aligned along with a direction belonging to equivalent crystal directions expressed by <001> in a cubic crystal system; and in a case where the direction is defined as a direction $d_A$, a period along the direction $d_A$ is 3-30 nm and a change of content ratio x of Ti and Al in the plane perpendicular to the direction $d_A$ is 0.01 or less; and (b) the region B is a region, in which the periodic content ratio change of Ti and Al is aligned along with a direction, which is perpendicular to the direction $d_A$, belonging to equivalent crystal directions expressed by <001> in a cubic crystal system; and in a case where the direction is defined as a direction $d_B$, a period along the direction $d_B$ is 3-30 nm and a change of content ratio x of Ti and Al in the plane perpendicular to the direction $d_B$ is 0.01 or less.

4. The surface coated cutting tool according to any one of claims 1 to 3, further comprising a lower layer between the cutting tool body made of any one of tungsten carbide-based cemented carbide, titanium carbonitride-based cermet, and cubic boron nitride-based ultra-high pressure sintered material; and the Ti and Al complex nitride or carbonitride layer, the lower layer comprises a Ti compound layer, which is made of one or more layer selected from a group consisting of a Ti carbide layer; a Ti nitride layer; a Ti carbonitride layer; a Ti carbonate layer; and a Ti oxycarbonitride layer, and has an average total layer thickness of 0.1-20 μm.

5. The surface coated cutting tool according to any one of claims 1 to 3, further comprising an upper layer in an upper part of the complex nitride or carbonitride layer the upper layer comprises at least an aluminum oxide layer with an average layer thickness of 1-25 μm.

6. The surface coated cutting tool according to any one of claims 1 to 3, the complex carbonitride layer is formed by a chemical vapor deposition method, a reaction gas component of which includes at least trimethyl aluminum.

7. The surface coated cutting tool according to claim 4, further comprising an upper layer in an upper part of the complex nitride or carbonitride layer, the upper layer comprises at least an aluminum oxide layer with an average layer thickness of 1-25 μm.

8. The surface coated cutting tool according to claim 4, the complex carbonitride layer is formed by a chemical vapor deposition method, a reaction gas component of which includes at least trimethyl aluminum.

9. The surface coated cutting tool according to claim 5, the complex carbonitride layer is formed by a chemical vapor deposition method, a reaction gas component of which includes at least trimethyl aluminum.

10. The surface coated cutting tool according to claim 7, the complex carbonitride layer is formed by a chemical vapor deposition method, a reaction gas component of which includes at least trimethyl aluminum.

* * * * *